US012787734B2

(12) United States Patent
Ho

(10) Patent No.: US 12,787,734 B2
(45) Date of Patent: Nov. 3, 2026

(54) SEMICONDUCTOR DEVICE STRUCTURE WITH LINER LAYER HAVING TAPERED SIDEWALL AND METHOD FOR PREPARING THE SAME

(71) Applicant: NANYA TECHNOLOGY CORPORATION, New Taipei City (TW)

(72) Inventor: Jar-Ming Ho, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 375 days.

(21) Appl. No.: 18/381,907

(22) Filed: Oct. 19, 2023

(65) Prior Publication Data

US 2025/0132193 A1 Apr. 24, 2025

(51) Int. Cl.
*H10W 20/00* (2026.01)
*H10W 20/41* (2026.01)
*H10W 20/46* (2026.01)

(52) U.S. Cl.
CPC ....... *H10W 20/082* (2026.01); *H10W 20/035* (2026.01); *H10W 20/056* (2026.01);
(Continued)

(58) Field of Classification Search
CPC ........... H01L 21/76804; H01L 21/7682; H01L 21/76846; H01L 23/5283; H01L 23/53238;
(Continued)

(56) References Cited

U.S. PATENT DOCUMENTS 753,843 A 3/1904 Betts
6,686,662 B2 * 2/2004 Merchant .......... H01L 21/76843 257/750
(Continued)

FOREIGN PATENT DOCUMENTS

CN 110085586 A 8/2019
CN 111566800 A 8/2020
(Continued)

OTHER PUBLICATIONS

Office Action and and the search report mailed on May 7, 2025 related to Taiwanese Application No. 113117339.
(Continued)

*Primary Examiner* — Ismail A Muse
(74) *Attorney, Agent, or Firm* — Xuan Zhang

(57) ABSTRACT

The present disclosure provides methods for fabricating low resistivity metal interconnect structures having self-formed diffusion barriers, and semiconductor devices including low resistivity metal interconnect structures having self-formed diffusion barriers. For example, the semiconductor device includes: a dielectric layer disposed on the substrate; an opening etched in the dielectric layer; a metal liner layer covering sidewall surfaces and a bottom surface of the opening in the dielectric layer; a copper material filling the opening to form an interconnect structure; and a self-forming diffusion barrier layer formed in a sidewall surface of the opening of the dielectric layer. The self-forming diffusion barrier layer includes manganese atoms diffused into sidewall surfaces of the dielectric layer.

17 Claims, 28 Drawing Sheets

(52) U.S. Cl.
CPC ....... *H10W 20/069* (2026.01); *H10W 20/072* (2026.01); *H10W 20/425* (2026.01); *H10W 20/435* (2026.01); *H10W 20/46* (2026.01)

(58) Field of Classification Search
CPC ....... H01L 2221/1063; H01L 21/76831; H01L 21/76843; H01L 21/76849; H01L 23/53295; H01L 23/5386; H01L 21/4846; H01L 21/76877; H01L 21/76897; H10W 20/082; H10W 20/035; H10W 20/056; H10W 20/069; H10W 20/072; H10W 20/425; H10W 20/435; H10W 20/46; H10W 20/033; H10W 20/037; H10W 20/076; H10W 20/47; H10W 20/0765; H10W 70/611; H10W 70/05; H10W 70/65
See application file for complete search history.

(56) References Cited

U.S. PATENT DOCUMENTS

| | | | | |
|---|---|---|---|---|
| 8,164,196 | B2 * | 4/2012 | Nishizawa | H01L 21/76814 257/774 |
| 8,492,897 | B2 | 7/2013 | Cabral, Jr et al. | |
| 9,711,713 | B1 | 7/2017 | Chou et al. | |
| 11,417,700 | B2 | 8/2022 | Huang et al. | |
| 12,009,301 | B2 | 6/2024 | Lee et al. | |
| 12,354,958 | B2 * | 7/2025 | Chin | H01L 23/5226 |
| 12,431,427 | B2 | 9/2025 | Huang | |
| 2002/0064941 | A1 * | 5/2002 | Chooi | H01L 21/76844 438/644 |
| 2002/0098673 | A1 * | 7/2002 | Yeh | H01L 21/76831 438/618 |
| 2004/0084746 | A1 | 5/2004 | Kim et al. | |
| 2005/0032354 | A1 | 2/2005 | Chu et al. | |
| 2005/0110147 | A1 | 5/2005 | Wu et al. | |
| 2006/0081986 | A1 | 4/2006 | Clevenger et al. | |
| 2007/0037385 | A1 | 2/2007 | Huebinger et al. | |
| 2010/0301491 | A1 * | 12/2010 | Yang | H01L 21/76814 438/653 |
| 2014/0035010 | A1 | 2/2014 | Cai et al. | |
| 2016/0379878 | A1 * | 12/2016 | Anderson | H01L 21/76852 257/754 |
| 2017/0033112 | A1 | 2/2017 | Cheng et al. | |
| 2018/0315704 | A1 | 11/2018 | Chen et al. | |
| 2019/0355812 | A1 * | 11/2019 | Li | H01L 21/30604 |
| 2020/0020716 | A1 | 1/2020 | Kim et al. | |
| 2021/0098346 | A1 | 4/2021 | Okuyama et al. | |
| 2021/0335663 | A1 * | 10/2021 | Hsueh | H01L 21/76846 |
| 2022/0051940 | A1 | 2/2022 | Lin et al. | |
| 2022/0149050 | A1 | 5/2022 | Huang | |
| 2022/0238666 | A1 | 7/2022 | Kim et al. | |
| 2024/0038666 | A1 * | 2/2024 | Cheng | H01L 23/5329 |
| 2024/0234313 | A1 | 7/2024 | Huang | |
| 2025/0132193 | A1 | 4/2025 | Ho | |
| 2025/0309112 | A1 | 10/2025 | Huang | |

FOREIGN PATENT DOCUMENTS

| | | | |
|---|---|---|---|
| TW | 434837 | B | 5/2001 |
| TW | 201923986 | A | 6/2019 |
| TW | 202207403 | A | 2/2022 |
| TW | 202211369 | A | 3/2022 |
| TW | 202303839 | A | 1/2023 |
| TW | 202306159 | A | 2/2023 |
| TW | 202314009 | A | 4/2023 |

OTHER PUBLICATIONS

Summary translation of Office Action and and the search report mailed on May 7, 2025 related to Taiwanese Application No. 11311339.
Office Action and and the search report mailed on Aug. 15, 2024 related to Taiwanese Application No. 112151159.
Office Action and and the search report mailed on Mar. 31, 2026 related to U.S. Appl. No. 18/520,114.
English abstract of the foreign patent documents of CN111566800A .

* cited by examiner

SEMICONDUCTOR DEVICE STRUCTURE WITH LINER LAYER HAVING TAPERED SIDEWALL AND METHOD FOR PREPARING THE SAME

TECHNICAL FIELD

The present disclosure relates to a semiconductor device structure and a method for preparing the same, and more particularly, to a semiconductor device structure with a liner layer having a tapered sidewall and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes complicated. An increase in complexity of increasingly manufacturing and integration of the semiconductor device may cause deficiencies, such as inadequate step coverage and/or voids. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first dielectric layer disposed over a semiconductor substrate; a second dielectric layer disposed over the first dielectric layer; a third dielectric layer disposed over the second dielectric layer; a spacer structure disposed in the second dielectric layer; a conductive structure disposed in the third dielectric layer, penetrating through the second dielectric layer, and extending into the first dielectric layer, wherein the conductive structure is surrounded by the spacer structure; a liner layer separating the conductive structure from the first dielectric layer, the second dielectric layer, and the spacer structure, wherein the liner layer has a tapered sidewall in direct contact with the first dielectric layer; an inner silicide portion disposed over the conductive structure; an outer silicide portion surrounding the inner silicide portion and covering the liner layer; and an upper plug disposed over the inner silicide portion and the outer silicide portion.

One aspect of the present disclosure provides a semiconductor device including a first dielectric layer disposed over a semiconductor substrate; a second dielectric layer disposed over the first dielectric layer; a third dielectric layer disposed over the second dielectric layer; a conductive structure disposed in the third dielectric layer, penetrating through the second dielectric layer, and extending into the first dielectric layer; a liner layer surrounding the conductive structure, wherein the liner layer has a tapered sidewall in direct contact with the first dielectric layer; a spacer structure disposed between the liner layer and the second dielectric layer, wherein the spacer structure is in direct contact with a top surface of the first dielectric layer; an inner silicide portion disposed over the conductive structure; an outer silicide portion surrounding the inner silicide portion and covering the liner layer; and an upper plug disposed over the inner silicide portion and the outer silicide portion.

Another aspect of the present disclosure provides a method for fabricating a semiconductor device including forming a first dielectric layer over a semiconductor substrate; forming a second dielectric layer over the first dielectric layer; performing a first etching process to form an opening structure, wherein the opening structure has a tapered profile, and wherein the opening structure has a lower opening in the first dielectric layer and an upper opening in the second dielectric layer; performing a second etching process to laterally extend the upper opening of the opening structure, such that a top surface of the first dielectric layer is exposed by an enlarged upper opening; forming a spacer structure over the top surface of the first dielectric layer; forming a liner layer covering the spacer structure; forming a conductive structure over and surrounded by the liner layer; recessing a top surface of the second dielectric layer; forming an inner silicide portion over the conductive structure and an outer silicide portion surrounding the inner silicide portion and over the conductive structure and the liner layer; and forming an upper plug over the inner silicide portion and the outer silicide portion.

Due to the design of the semiconductor device structure of the present disclosure, the liner layer including the tapered sidewall in direct contact with the first dielectric layer, which helps to improve the step coverage of the liner layer and the overlying conductive structure. Moreover, adequate step coverage of the conductive structure can reduce electromigration (EM). As a result, performance and reliability of the semiconductor device structure can be improved. In addition, the inner silicide portion and the outer silicide portion constitute a composite landing pad with an increased landing area for the upper plug to land on. Therefore, the contact resistance may be reduced, and the misalignment issues between the lower conductive structure and the upper plug may be prevented or reduced. As a result, the overall device performance may be improved, and the yield rate of the semiconductor device structure may be increased.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
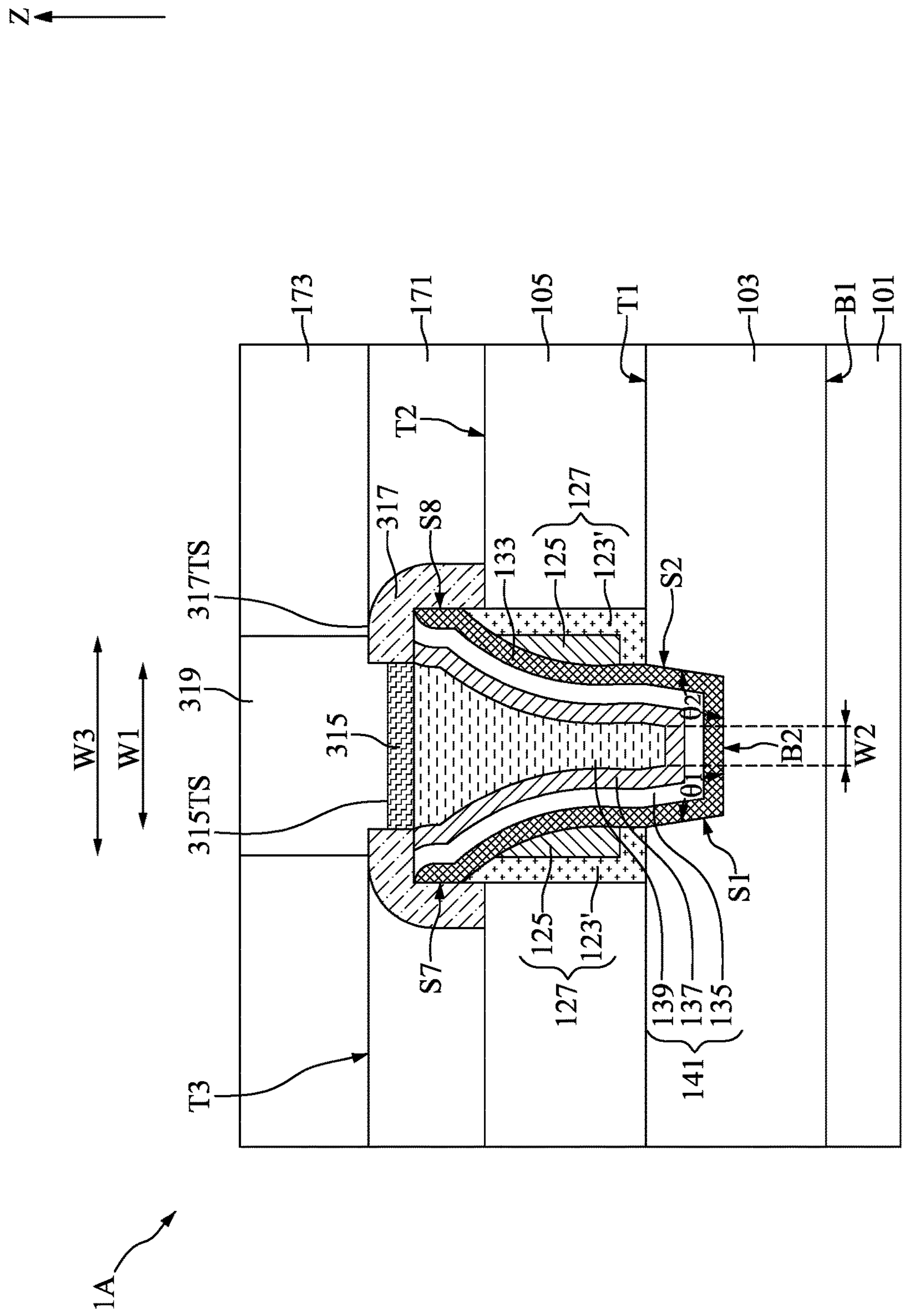
FIGS. 1 to 3 are cross-sectional views illustrating semiconductor device structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 1A, in accordance with some embodiments. As shown in FIG. 1, the semiconductor device structure 1A includes a semiconductor substrate 101, a first dielectric layer 103 disposed over the semiconductor substrate 101, a second dielectric layer 105 disposed over the first dielectric layer 103, a third dielectric layer 171 disposed over the second dielectric layer 105, and a fourth dielectric layer 173 disposed over the third dielectric layer 171, in accordance with some embodiments.

In some embodiments, the semiconductor device structure 1A also includes a spacer structure 127 disposed in the second dielectric layer 105. In some embodiments, the spacer structure 127 is disposed over and in direct contact with the top surface T1 of the first dielectric layer 103. In some embodiments, the spacer structure 127 includes an L-shaped liner 123' and a porous low-k dielectric layer 125 disposed over the L-shaped liner 123'. In some embodiments, the top portion of the L-shaped liner 123' protrudes from the top surface T2 of the second dielectric layer 105.

In some embodiments, the semiconductor device structure 1A further includes a liner layer 133 covering the spacer structure 127. In some embodiments, the liner layer 133 is disposed within the third dielectric layer 171 and extends into the second dielectric layer 105 and the first dielectric layer 103. In some embodiments, the vertical sidewalls S7 and S8 of the liner layer 133 are in direct contact with the third dielectric layer 171. In addition, the liner layer 133 is in direct contact with the spacer structure 127 and the first dielectric layer 103, in accordance with some embodiments. As shown in FIG. 1, the bottom surface B2 of the liner layer 133 is lower than the top surface T1 of the first dielectric layer 103, and higher than the bottom surface B1 of the first dielectric layer 103, in accordance with some embodiments.

Moreover, the liner layer 133 has tapered sidewalls S1 and S2 in direct contact with the first dielectric layer 103, in accordance with some embodiments. As shown in FIG. 1, the liner layer 133 has an angle $\theta_1$ between the sidewall S1 and the bottom surface B2, and another angle $\theta_2$ between the sidewall S2 and the bottom surface B2. In some embodiments, each of the angles $\theta_1$ and $\theta_2$ is greater than 90 degrees. In some embodiments, the porous low-k dielectric layer 125 is enclosed by the liner layer 133 and the L-shaped liner 123' of the spacer structure 127.

In some embodiments, the semiconductor device structure 1A includes a conductive structure 141 disposed over and surrounded by the liner layer 133. In some embodiments, the conductive structure 141 includes a barrier layer 135 conformally disposed over and surrounded by the liner layer 133, a metal layer 137 disposed over and surrounded by the barrier layer 135, and a metal filling portion 139 disposed over and surrounded by the metal layer 137. In some embodiments, the conductive structure 141 is surrounded by the spacer structure 127.

Still referring to FIG. 1, the metal filling portion 139 of the conductive structure 141 has a tapered profile with a bottom portion of the metal filling portion 139 being narrower than a respective top portion of the metal filling portion 139, in accordance with some embodiments. For example, the metal filling portion 139 has a top width W1 and a bottom width W2, and the top width W1 is greater than the bottom width W2. In some embodiments, the conductive structure 141 has a tapered profile with a bottom portion of the conductive structure 141 being narrower than a respective top portion of the conductive structure 141.

Moreover, in some embodiments, the conductive structure 141 penetrates through the third dielectric layer 171 and the second dielectric layer 105 and extends into an upper portion of the first dielectric layer 103. In some embodiments, the conductive structure 141 is separated from the first dielectric layer 103, the second dielectric layer 105, and the spacer structure 127 by the liner layer 133. In some embodiments, the metal layer 137 of the conductive structure 141 includes copper-manganese (Cu—Mn) alloy, and the metal filling portion 139 of the conductive structure 141 includes copper (Cu).

Still referring to FIG. 1, the semiconductor device structure 1A includes an inner silicide portion 315 and an outer silicide portion 317 disposed in the third dielectric layer 171. In some embodiments, the inner silicide portion 315 is disposed over the metal filling portion 139. In some embodiments, the outer silicide portion 317 is disposed over the metal layer 137, the barrier layer 135, the liner layer 133, and the L-shaped liner 123'. In some embodiments, the outer silicide portion 317 is disposed over the metal layer 137, the barrier layer 135, and the liner layer 133. It should be noted that the top surface 317TS of the outer silicide portion 317 is higher than the top surface 315TS of the inner silicide portion 315, in accordance with some embodiments. In some embodiments, the top surface 317TS of the outer silicide portion 317 is the topmost surface of the outer silicide portion 317, and the top surface 315TS of the inner silicide portion 315 is the topmost surface of the inner silicide portion 315. In some embodiments, the top surface 317TS of the outer silicide portion 317 and the top surface T3 of the third dielectric layer 171 are substantially coplanar.

Still referring to FIG. 1, the semiconductor device structure 1A includes an upper plug 319 disposed in the fourth dielectric layer 173 and extending to the third dielectric layer 171. The upper plug 319 is disposed over the inner silicide portion 315 and the outer silicide portion 317. In some embodiments, the upper portion of the upper plug 319 is disposed in the fourth dielectric layer 173 and the lower portion of the upper plug 319 is disposed in the third dielectric layer 171. In some embodiments, the width W3 of the upper plug 319 is greater than the top width W1 of the metal filling portion 139.

Figure 2:
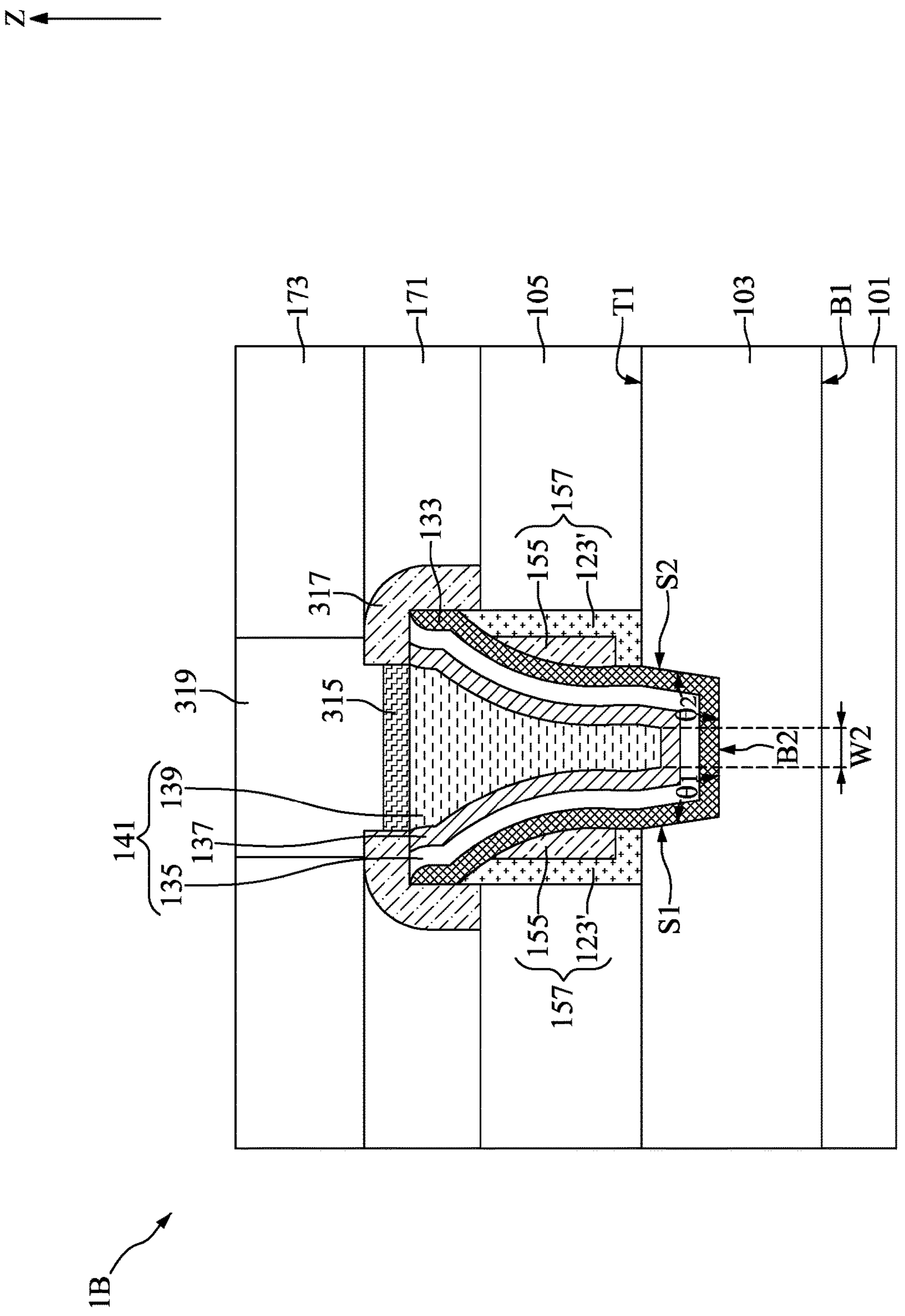

FIG. 2 is a cross-sectional view illustrating a semiconductor device structure 1B, in accordance with some other embodiments. The semiconductor device structure 1B is similar to the semiconductor device structure 1A. However, in the semiconductor device structure 1B, the porous low-k dielectric layer 125 is replaced by an energy removable layer 155, and a spacer structure 157 including the L-shaped liner 123' and the energy removable layer 155 is obtained, in accordance with some embodiments.

In some embodiments, the energy removable layer 155 of the spacer structure 157 is enclosed by the liner layer 133 and the L-shaped liner 123' of the spacer structure 157. Details regarding this embodiment that are similar to those for the previously described embodiment will not be repeated herein.

Figure 3:
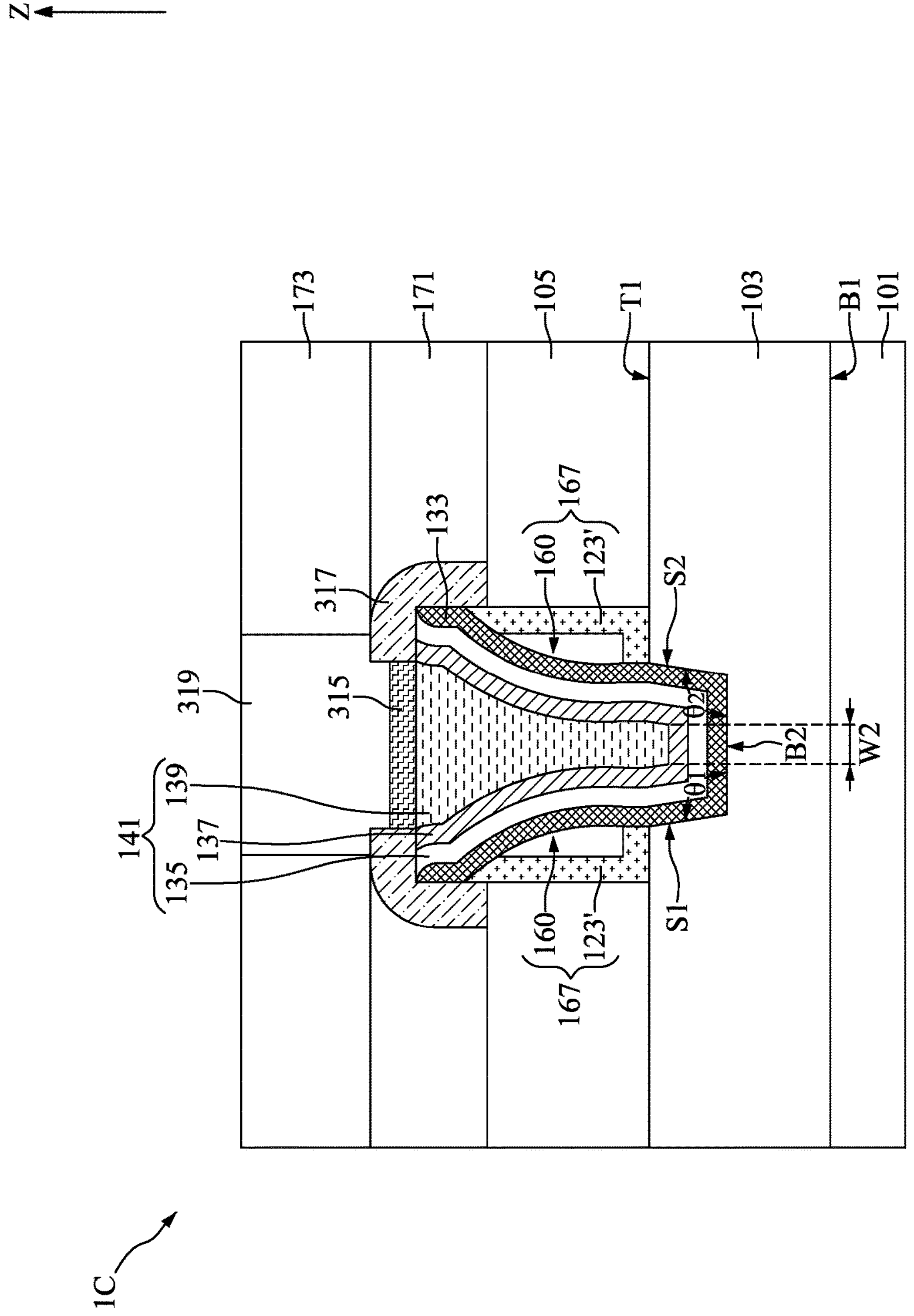

FIG. 3 is a cross-sectional view illustrating a semiconductor device structure 1C, in accordance with some other embodiments. The semiconductor device structure 1C is similar to the semiconductor device structure 1B. However, in the semiconductor device structure 1C, the energy removable layer 155 is replaced by an air gap 160, and a spacer structure 167 including the L-shaped liner 123' and the air gap 160 is obtained, in accordance with some embodiments.

In some embodiments, the semiconductor device structure 1C is formed by performing a heat treatment process to the semiconductor device structure 1B, and the energy removable layer 155 is transformed into the air gap 160 during the heat treatment process. In some embodiments, the air gap 160 of the spacer structure 167 is enclosed by the liner layer 133 and the L-shaped liner 123' of the spacer structure 167. Details regarding this embodiment that are similar to those for the previously described embodiment will not be repeated herein.

Figure 4:
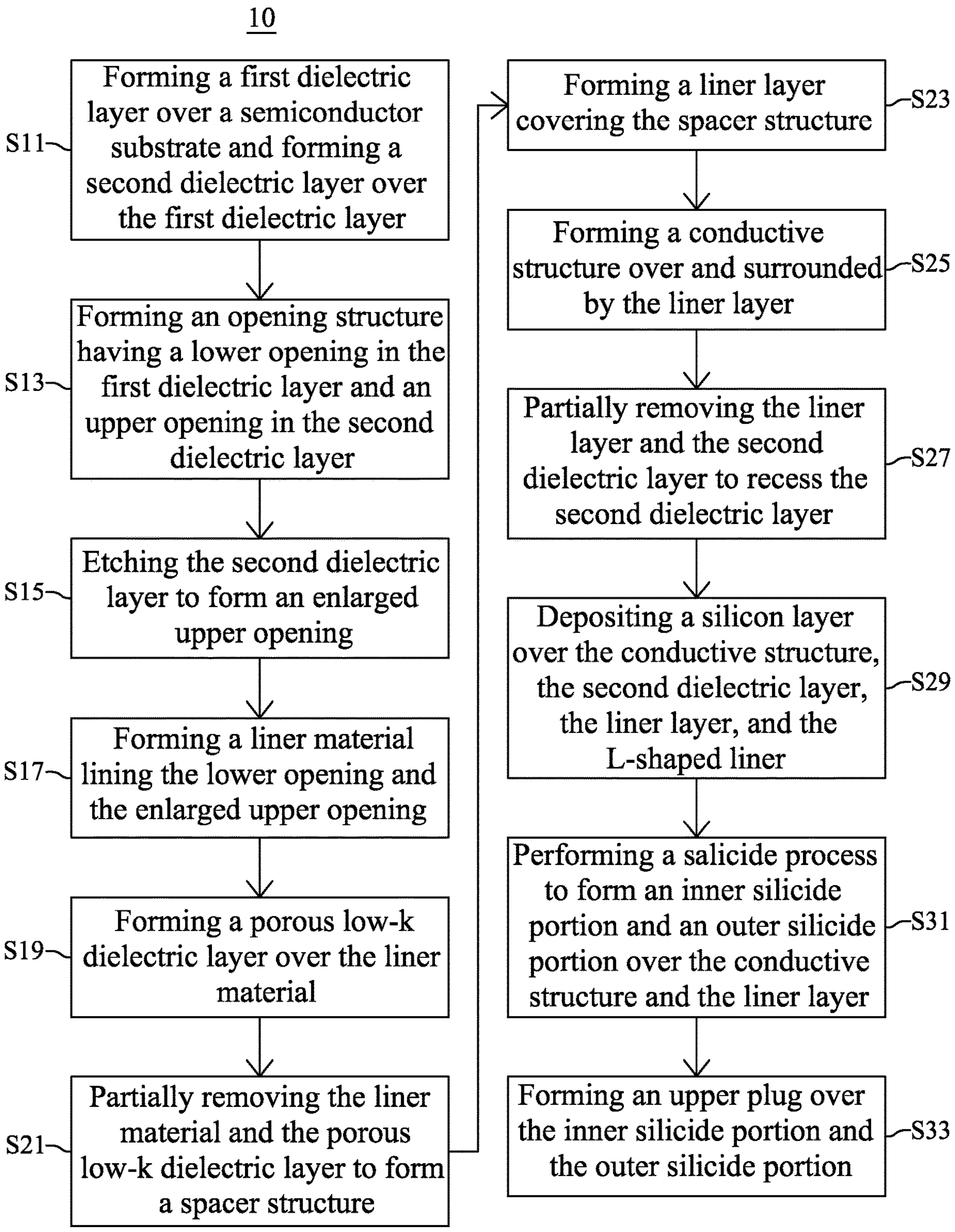
FIG. 4 is a flow diagram illustrating a method for preparing a semiconductor device structure, in accordance with one embodiment.

FIG. 4 is a flow diagram illustrating a method 10 for preparing the semiconductor device structure 1A, and the method 10 includes steps S11, S13, S15, S17, S19, S21, S23, S25, S27, S29, S31, and S33, in accordance with some embodiments. The steps S11 to S33 of FIG. 4 are elaborated in connection with the following figures, such as FIG. 1 and FIGS. 5 to 21.

Figure 5:
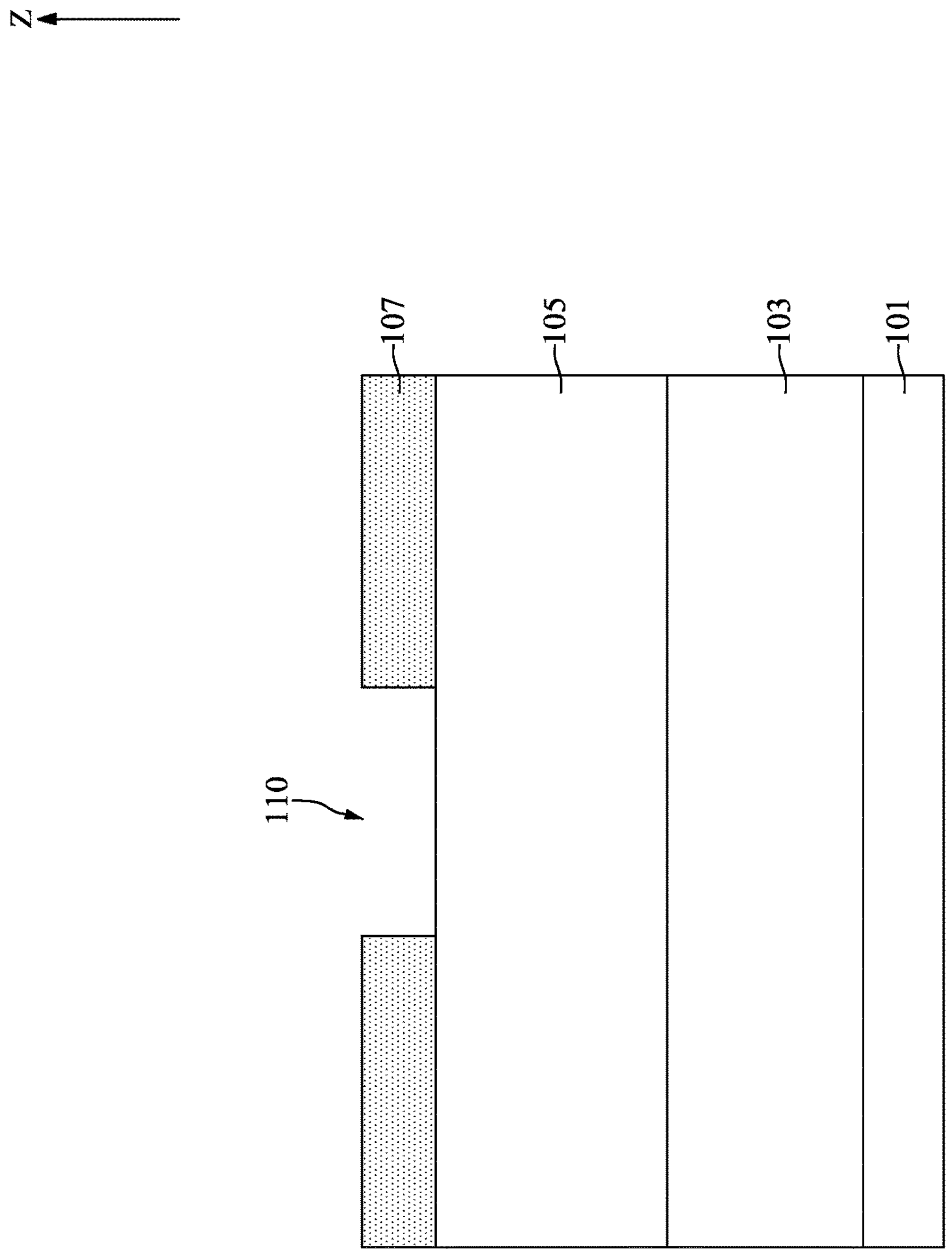
FIGS. 5 to 21 are cross-sectional views illustrating a flow for fabricating a semiconductor device structure in accordance with one embodiment.

FIGS. 5 to 21 are cross-sectional views illustrating intermediate stages of forming the semiconductor device structure 1A, in accordance with some embodiments. As shown in FIG. 5, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 is formed over the semiconductor substrate 101, as shown in FIG. 5 in accordance with some embodiments. The respective step is illustrated as the step S11 in the method 10 shown in FIG. 4. In some embodiments, the first dielectric layer 103 is made of silicon oxide, silicon nitride, silicon oxynitride, a low-k dielectric material or another suitable material. The first dielectric layer 103 may be formed by a deposition process, such as a chemical vapor deposition (CVD) process, a physical vapor deposition (PVD) process, an atomic layer deposition (ALD) process, a spin-on coating process, or another suitable method.

Next, a second dielectric layer 105 is formed over the first dielectric layer 103, as shown in FIG. 5 in accordance with some embodiments. Some materials and processes used to form the second dielectric layer 105 are similar to, or the same as, those used to form the first dielectric layer 103, and details thereof are not repeated herein. The respective step is illustrated as the step S11 in the method 10 shown in FIG. 4.

Still referring to FIG. 5, a patterned mask 107 with an opening 110 is formed over the second dielectric layer 105, in accordance with some embodiments. In some embodiments, the second dielectric layer 105 is partially exposed by the opening 110. In some embodiments, the second dielectric layer 105 and the patterned mask 107 include different materials so that the etching selectivity may be different in the subsequent etching process.

Figure 6:
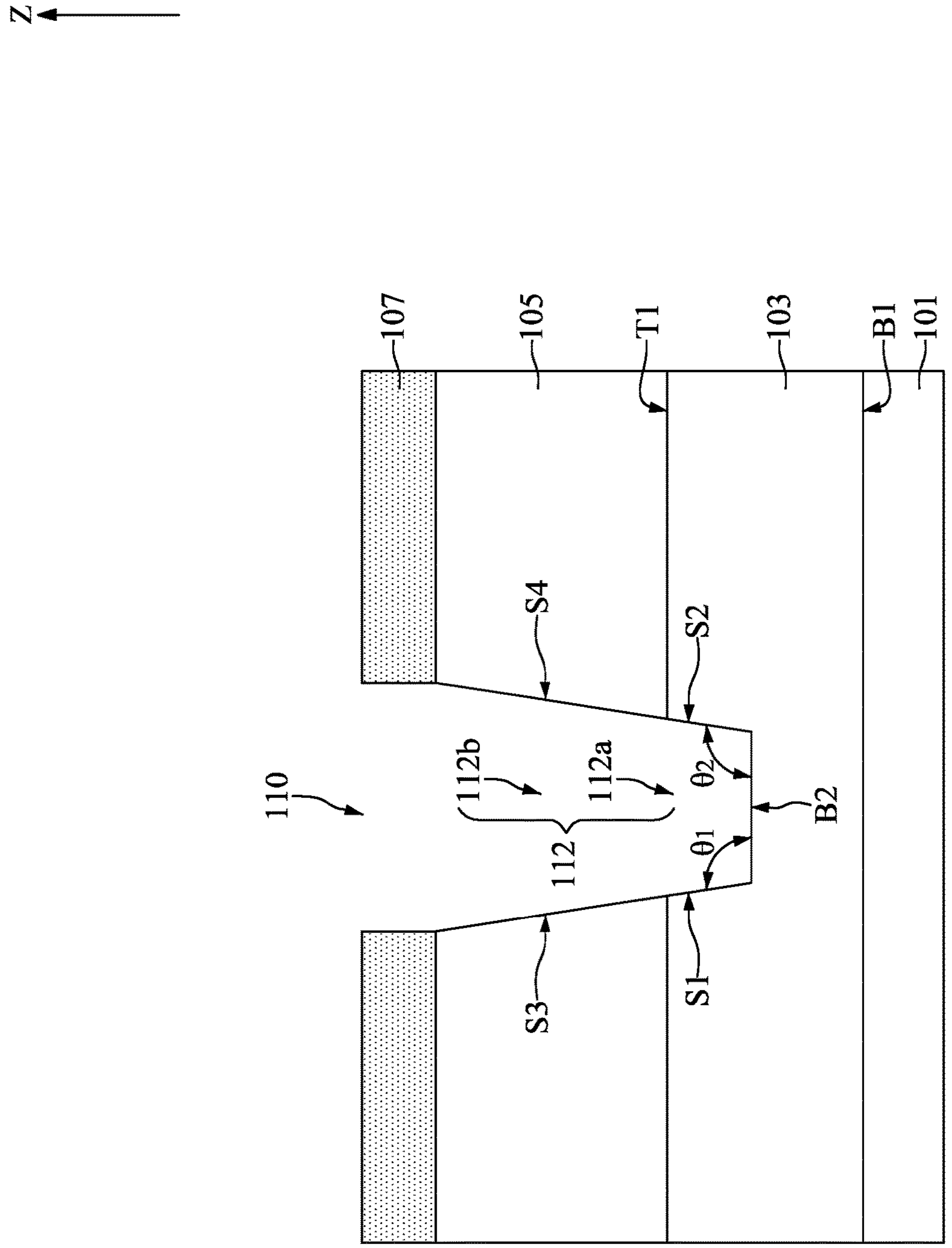

Subsequently, an etching process (also referred to as a first etching process) is performed using the patterned mask 107 as a mask, such that an opening structure 112 is formed in the first dielectric layer 103 and the second dielectric layer 105, as shown in FIG. 6 in accordance with some embodiments. In some embodiments, the opening structure 112 includes a lower opening 112*a* in the first dielectric layer 103 and an upper opening 112*b* in the second dielectric layer 105. The respective step is illustrated as the step S13 in the method 10 shown in FIG. 4. In some embodiments, the first etching process includes a wet etching process, a dry etching process, or a combination thereof.

In some embodiments, the opening structure 112 penetrates through the second dielectric layer 105 and extends into an upper portion of the first dielectric layer 103. In other words, the opening structure 112 stops at an intermediate level of the first dielectric layer 103. For example, the bottom surface B2 of the opening structure 112 is located between the top surface T1 and the bottom surface B1 of the first dielectric layer 103, as shown in FIG. 6 in accordance with some embodiments.

Moreover, the opening structure 112 has a tapered profile with a bottom portion of the opening structure 112 being narrower than a respective top portion of the opening structure 112, in accordance with some embodiments. In some embodiments, the opening structure 112 has tapered sidewalls, such as the sidewalls S1 and S2 in the first dielectric layer 103, and the sidewalls S3 and S4 in the second dielectric layer 105. In some embodiments, the sidewall S1 is aligned with the sidewall S3, and an angle $\theta_1$ between the sidewall S1 and the bottom surface B2 of the opening structure 112 is greater than 90 degrees. In some embodiments, the sidewall S2 is aligned with the sidewall S4, and an angle $\theta_2$ between the sidewall S2 and the bottom surface B2 of the opening structure 112 is greater than 90 degrees. After the opening structure 112 is formed, the patterned mask 107 is removed. In some embodiments, the patterned mask 107 is removed by a stripping process, an ashing process, an etching process, or another suitable process. After the patterned mask 107 is removed, the top surface T2 of the second dielectric layer 105 is exposed (not shown).

Figure 7:
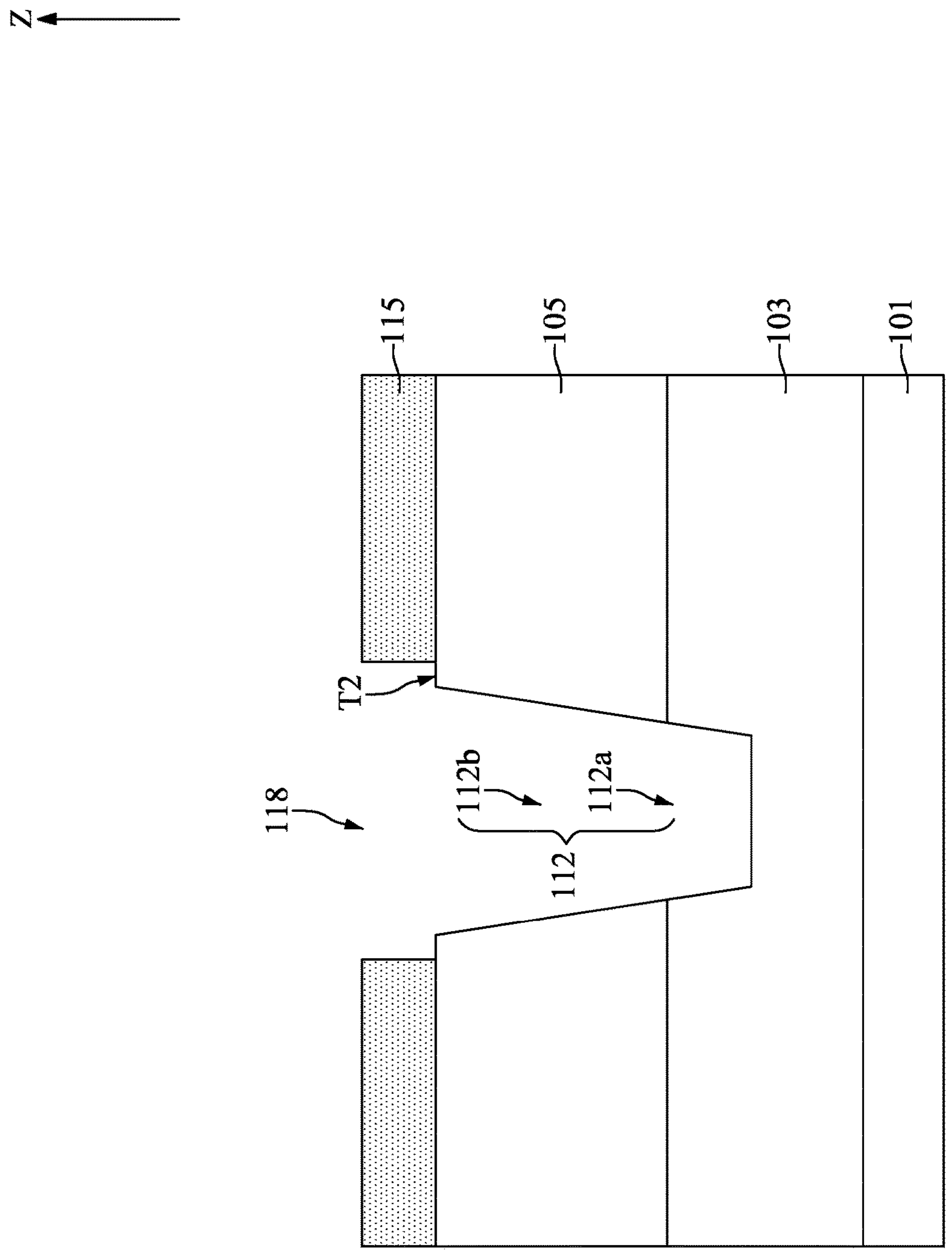

Next, a patterned mask 115 with an opening 118 is formed over the second dielectric layer 105, as shown in FIG. 7 in accordance with some embodiments. In some embodiments, the portions of the top surface T2 of the second dielectric layer 105 close to the opening structure 112 are exposed by the opening 118 of the patterned mask 115. In some embodiments, the second dielectric layer 105 and the patterned mask 115 include different materials so that the etching selectivity may be different in the subsequent etching process.

Figure 8:
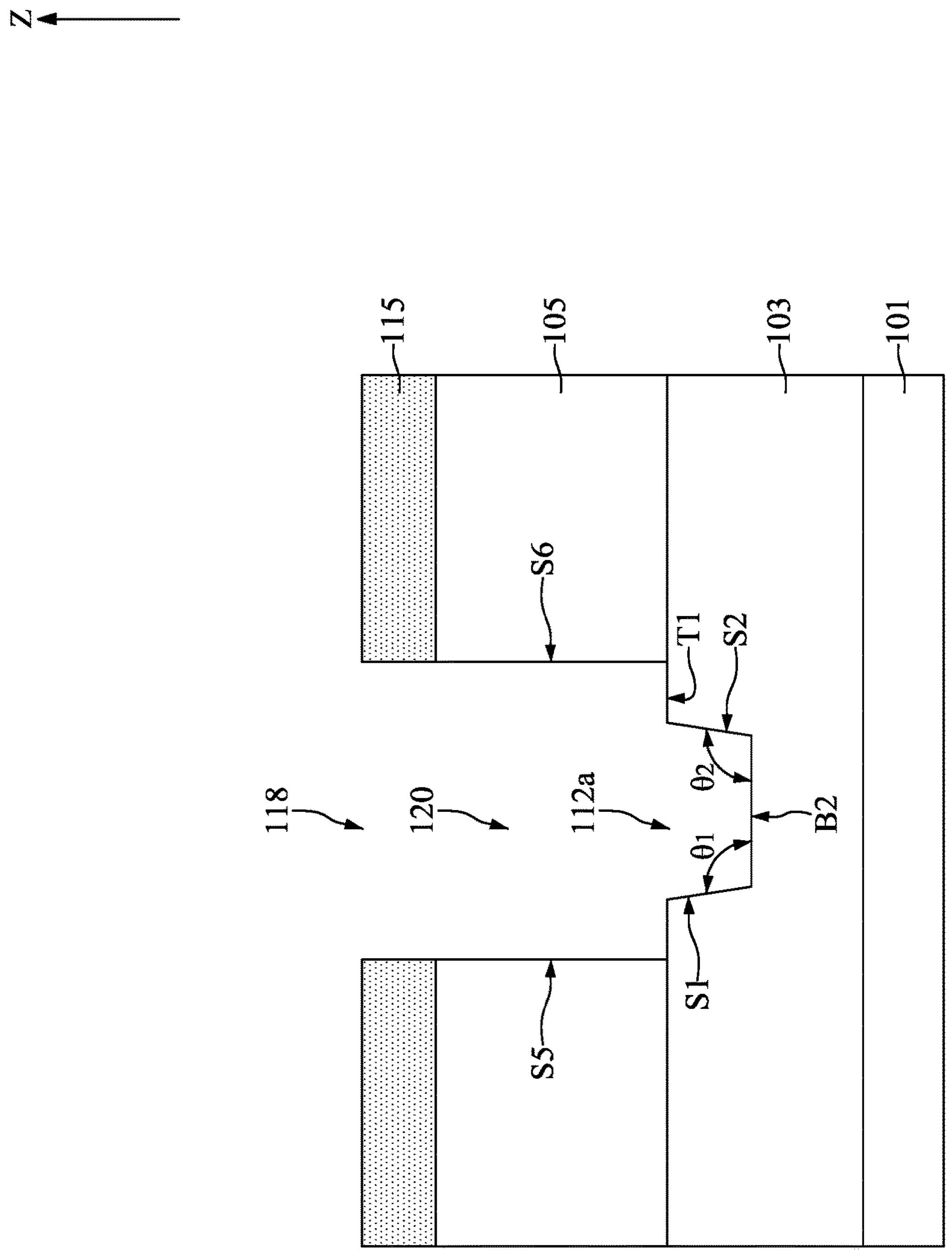

Subsequently, an etching process (also referred to as a second etching process) is performed using the patterned mask 115 as a mask, such that an enlarged upper opening 120 is formed in the second dielectric layer 105, as shown in FIG. 8 in accordance with some embodiments. In some embodiments, the upper opening 112*b* of the opening structure 112 (see FIG. 7) is laterally extended by the second etching process. As a result, sidewalls S5 and S6 of the enlarged upper opening 120 are obtained, and the top surface T1 of the first dielectric layer 103 is partially exposed by the enlarged upper opening 120. The respective step is illustrated as the step S15 in the method 10 shown in FIG. 4.

In some embodiments, the lower opening 112*a* of the original opening structure 112 substantially remains intact during the second etching process. Within the context of this disclosure, the word "substantially" means preferably at least 90%, more preferably 95%, even more preferably 98%, and most preferably 99%. In some embodiments, after the second etching process is performed, both the angle $\theta_1$ and the angle $\theta_2$ are greater than 90 degrees. After the enlarged upper opening 120 is formed, the patterned mask 115 may be removed.

Figure 9:
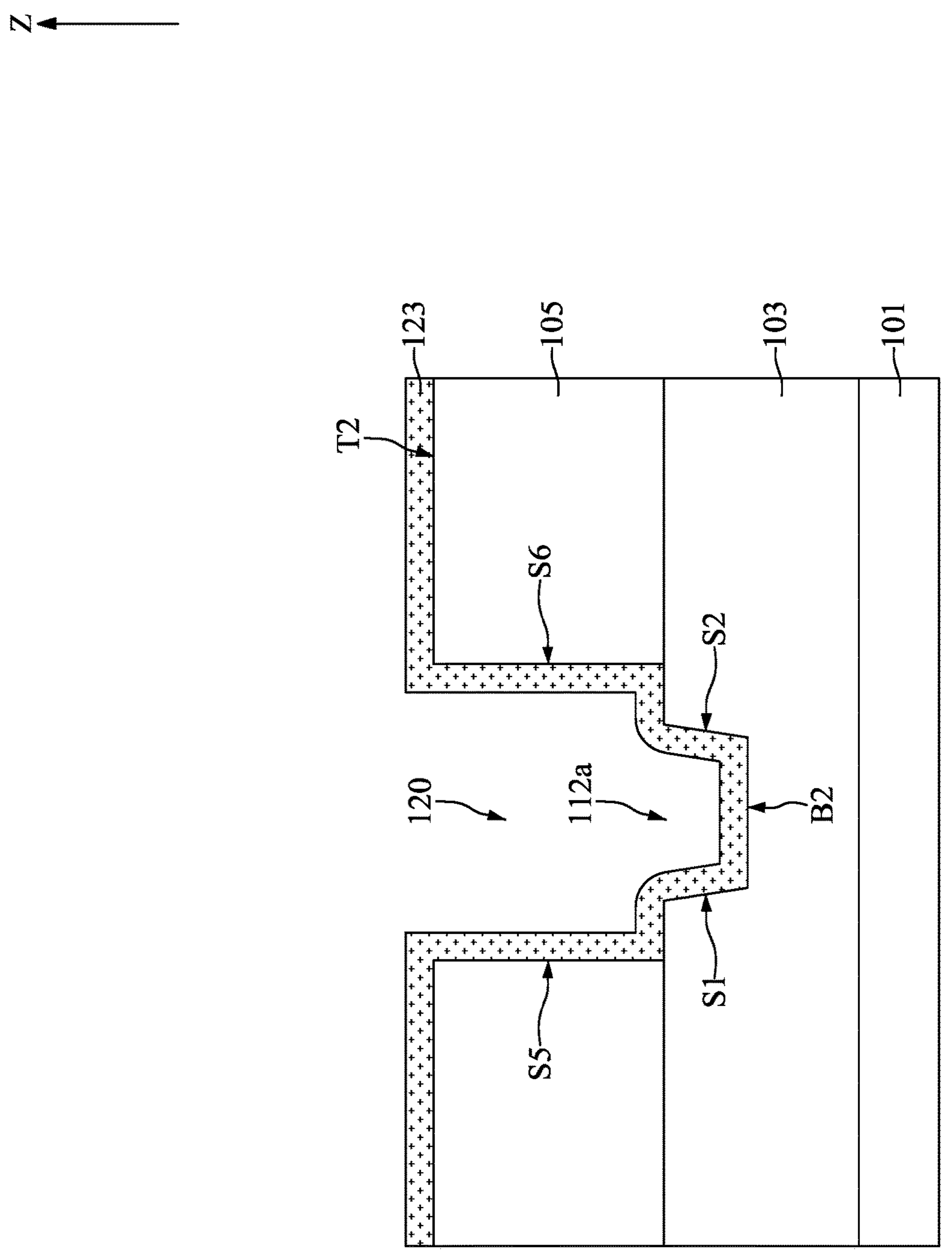

Then, a liner material 123 is formed lining the lower opening 112*a* and the enlarged upper opening 120, as shown in FIG. 9 in accordance with some embodiments. The respective step is illustrated as the step S17 in the method 10 shown in FIG. 4. In some embodiments, the liner material 123 is conformally formed over the structure of FIG. 8 after the patterned mask 115 is removed.

In some embodiments, the liner material 123 is formed lining the bottom surface B2 and the sidewalls S1, S2 of the lower opening 112*a*, and lining the sidewalls S5, S6 of the enlarged upper opening 120. In some embodiments, the portions of the top surface T1 of the first dielectric layer 103 exposed by the enlarged upper opening 120 are covered by and in direct contact with the liner material 123. In some embodiments, the liner material 123 further extends to cover the top surface T2 of the second dielectric layer 105.

Moreover, in some embodiments, the liner material 123 is made of a dielectric material, such as silicon nitride, a silicon nitride-based material (e.g., SiON, SiCN or SiOCN), or another suitable dielectric material. In some embodiments, the liner material 123 is formed by a deposition process, such as a CVD process, a PVD process, an ALD process, or another suitable method.

Figure 10:
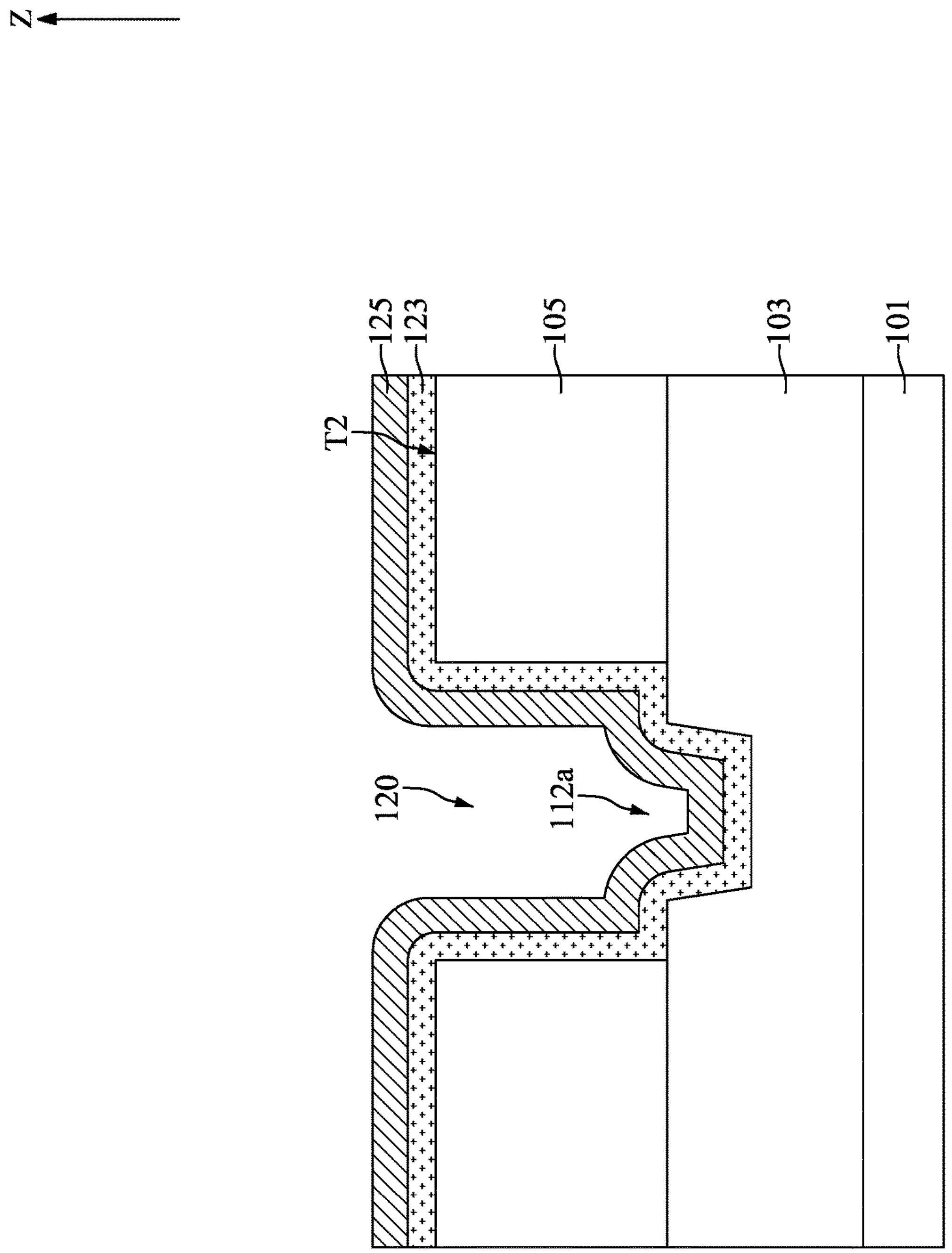

Next, a porous low-k dielectric layer 125 is formed over the liner material 123, as shown in FIG. 10 in accordance with some embodiments. The respective step is illustrated as the step S19 in the method 10 shown in FIG. 4. In some embodiments, the porous low-k dielectric layer 125 is conformally formed over the structure of FIG. 9.

In some embodiments, the porous low-k dielectric layer 125 is made of silicon oxide, silicon nitride, silicon oxynitride, or another suitable low-k material. The dielectric constants (k values) of the low-k dielectric materials may be lower than about 3.0, for example. In some embodiments, the porous low-k dielectric layer 125 is formed by a deposition process, such as a CVD process, a PVD process, an ALD process, or another suitable method.

Figure 11:
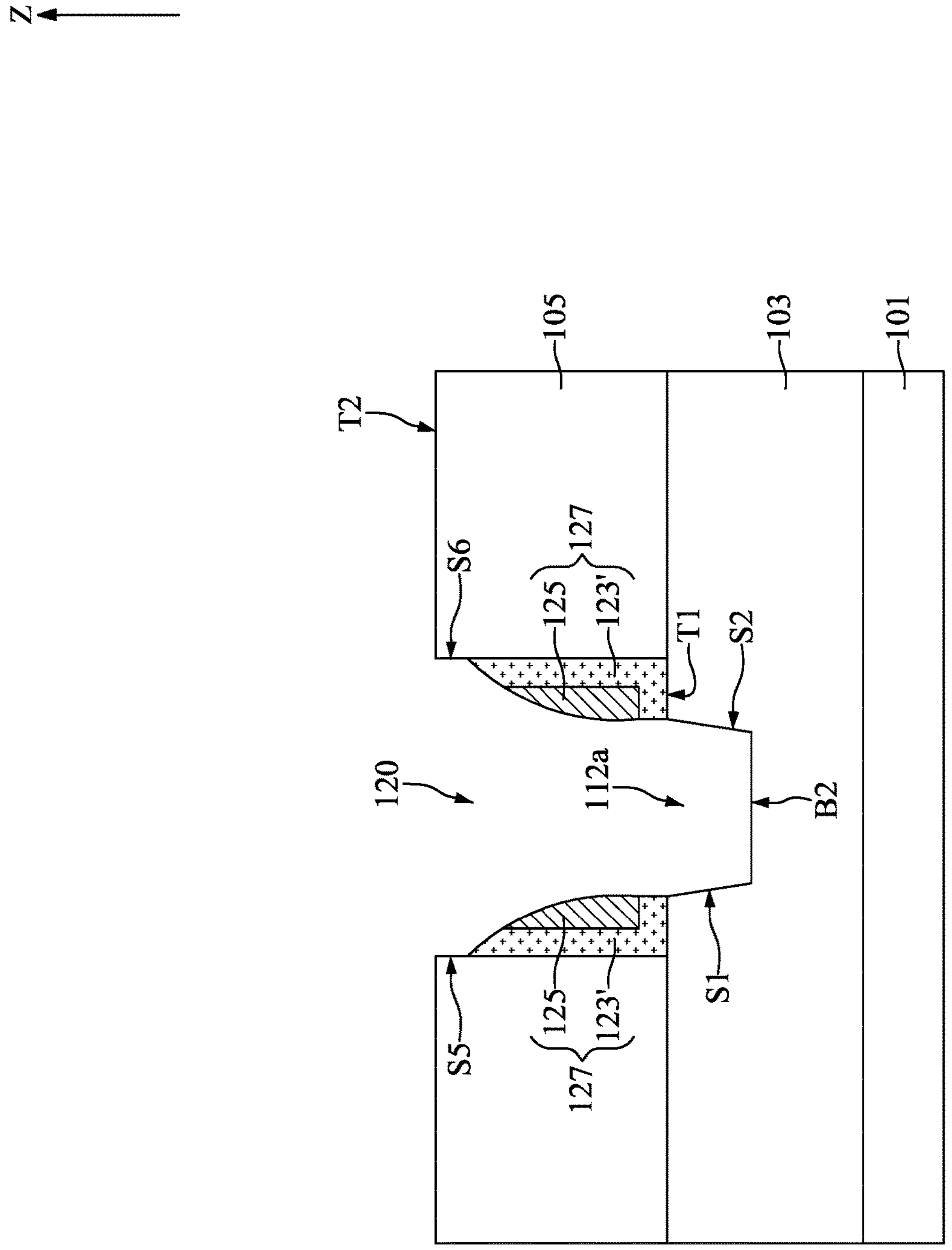

Subsequently, an etching process (also referred to as a third etching process) is performed to partially remove the liner material 123 and the porous low-k dielectric layer 125, such that a spacer structure 127 including the remaining portions of the liner material 123 and the porous low-k dielectric layer 125 is obtained, as shown in FIG. 11 in accordance with some embodiments. The respective step is illustrated as the step S21 in the method 10 shown in FIG. 4. In some embodiments, the remaining portion of the liner material 123 has an "L" shape, which is referred to as an L-shaped liner 123'.

In some embodiments, after the third etching process is performed, the sidewalls S5 and S6 of the enlarged upper opening 120 are partially exposed by the spacer structure 127, and the sidewalls S1, S2 and the bottom surface B2 of the lower opening 112*a* are exposed. In some embodiments, the exposed portions of the sidewalls S5 and S6 are above the spacer structure 127. In some embodiments, the top surface T2 of the second dielectric layer 105 is exposed after the spacer structure 127 is formed.

In some embodiments, the liner material 123 and the porous low-k dielectric layer 125 are etched by an anisotropic etching process, which removes the same amount of the liner material 123 and the porous low-k dielectric layer 125 vertically in all places, leaving the spacer structure 127 on the lower portions of the sidewalls S5 and S6 of the second dielectric layer 105. In some embodiments, the third etching process is a dry etching process, such as plasma etching, reactive ion etching (RIE), neutral beam etching (NBE), or the like.

Figure 12:
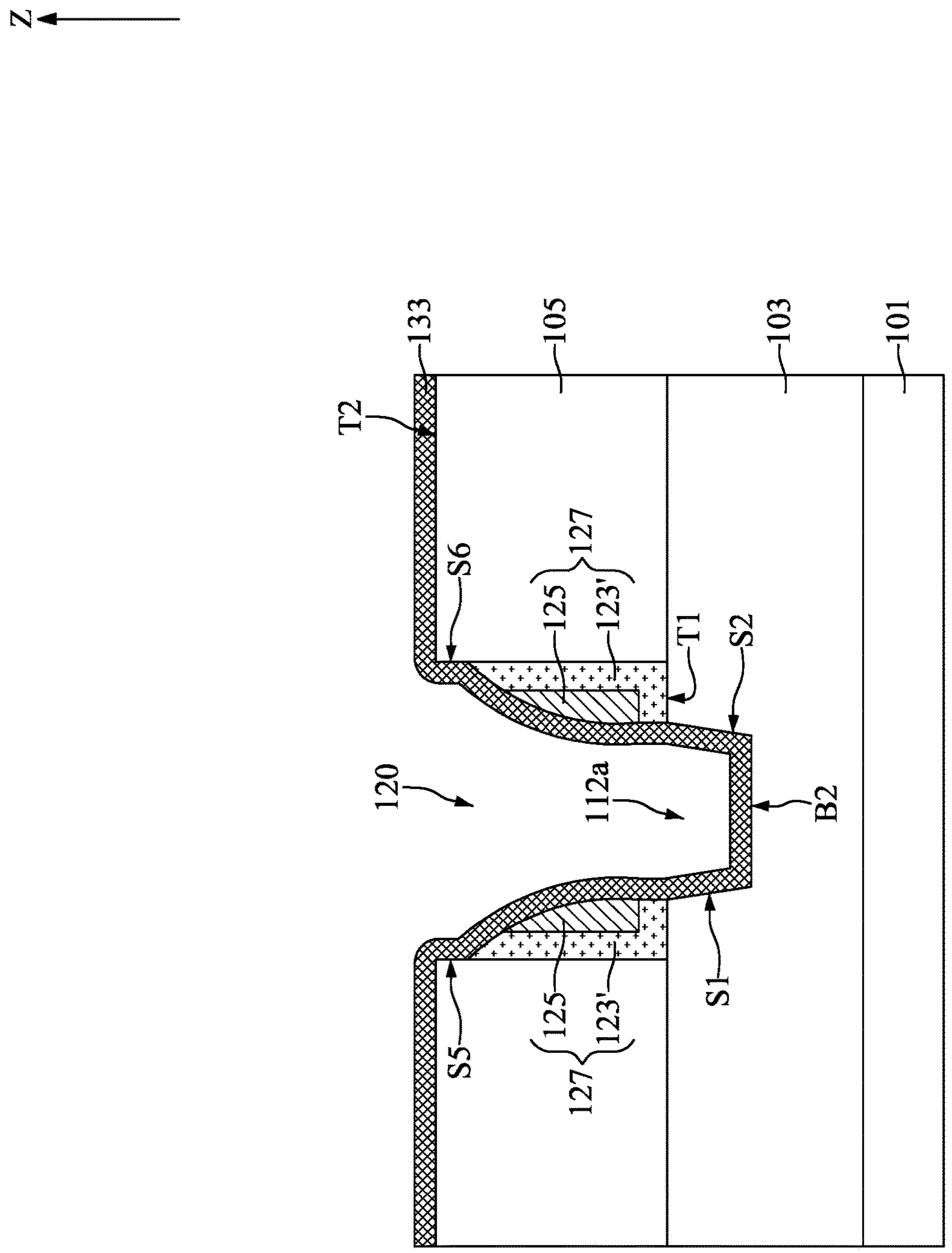

Then, a liner layer 133 is conformally formed over the structure of FIG. 11, and the spacer structure 127 is covered by the liner layer 133, as shown in FIG. 12 in accordance with some embodiments. The respective step is illustrated as the step S23 in the method 10 shown in FIG. 4. In some embodiments, the liner layer 133 is formed lining the bottom surface B2 and the sidewalls S1, S2 of the lower opening 112*a*.

In some embodiments, the liner layer 133 is formed covering the spacer structure 127 and the portions of the sidewalls S5, S6 exposed by the spacer structure 127. In some embodiments, the liner layer 133 further extends to cover the top surface T2 of the second dielectric layer 105. In some embodiments, the porous low-k dielectric layer 125 of the spacer structure 127 is enclosed by the L-shaped liner 123' and the liner layer 133.

In some embodiments, the liner layer 133 is made of a dielectric material, such as silicon nitride, a silicon nitride-based material (e.g., SiON, SiCN or SiOCN), or another suitable dielectric material. In some embodiments, the liner layer 133 is formed by a deposition process, such as a CVD process, a PVD process, an ALD process, or another suitable method. After the liner layer 133 is formed, the sidewalls S1 and S2 of the lower opening 112*a* are also referred to as the tapered sidewalls of the liner layer 133, and the bottom surface B2 of the lower opening 112*a* is also referred to as the bottom surface of the liner layer 133.

Figure 13:
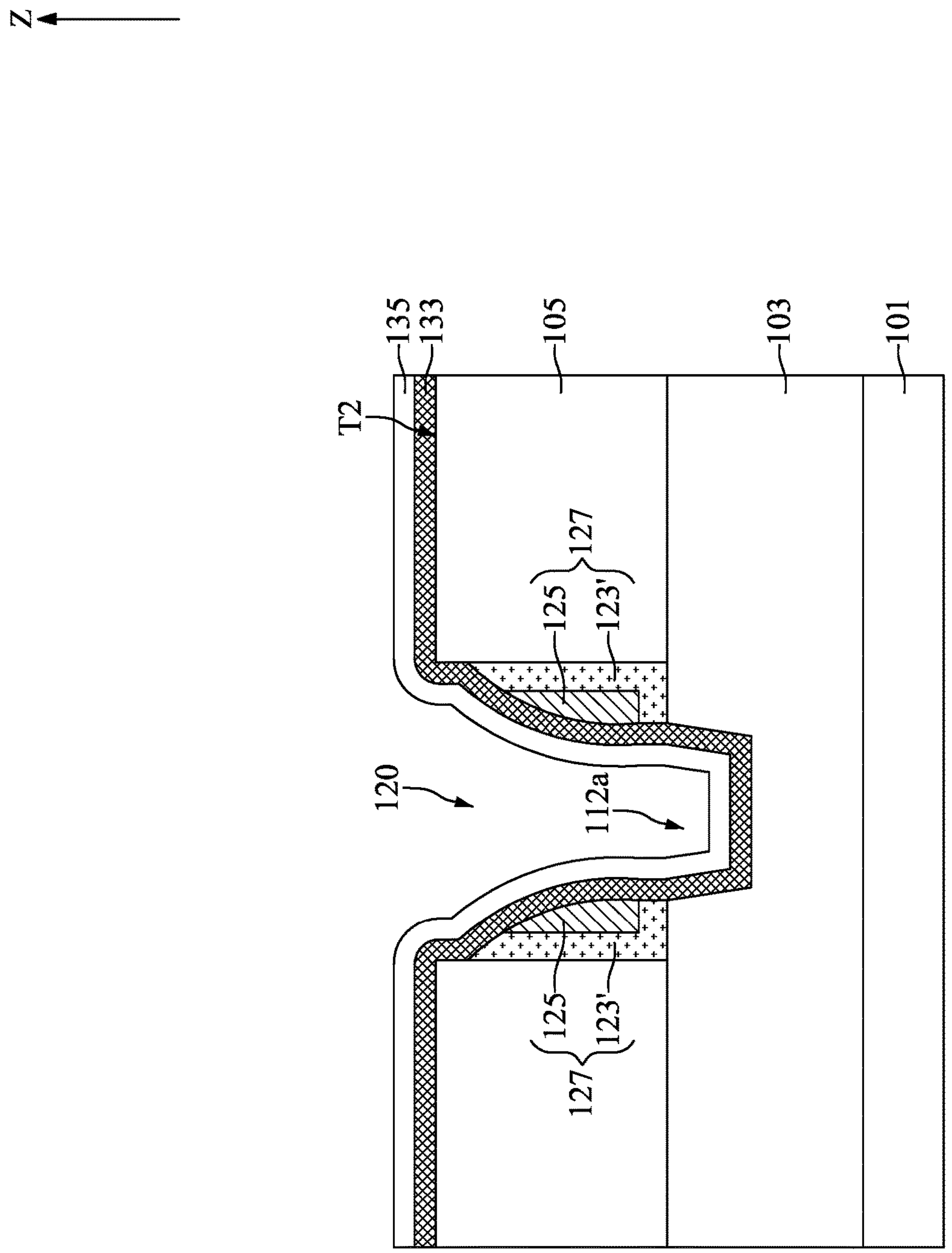

Next, a barrier layer 135 is conformally formed over the liner layer 133, as shown in FIG. 13 in accordance with some embodiments. In some embodiments, the barrier layer 135 further extends over the top surface T2 of the second dielectric layer 105. In some embodiments, the barrier layer 135 is made of tantalum (Ta), tantalum nitride (TaN), titanium (Ti), titanium nitride (TiN), cobalt tungsten (CoW), another suitable material, or a combination thereof. Moreover, the barrier layer 135 may be formed by a deposition process, such as a CVD process, a PVD process, an ALD process, a metal organic chemical vapor deposition (MOCVD) process, a sputtering process, a plating process, or another suitable process.

Figure 14:
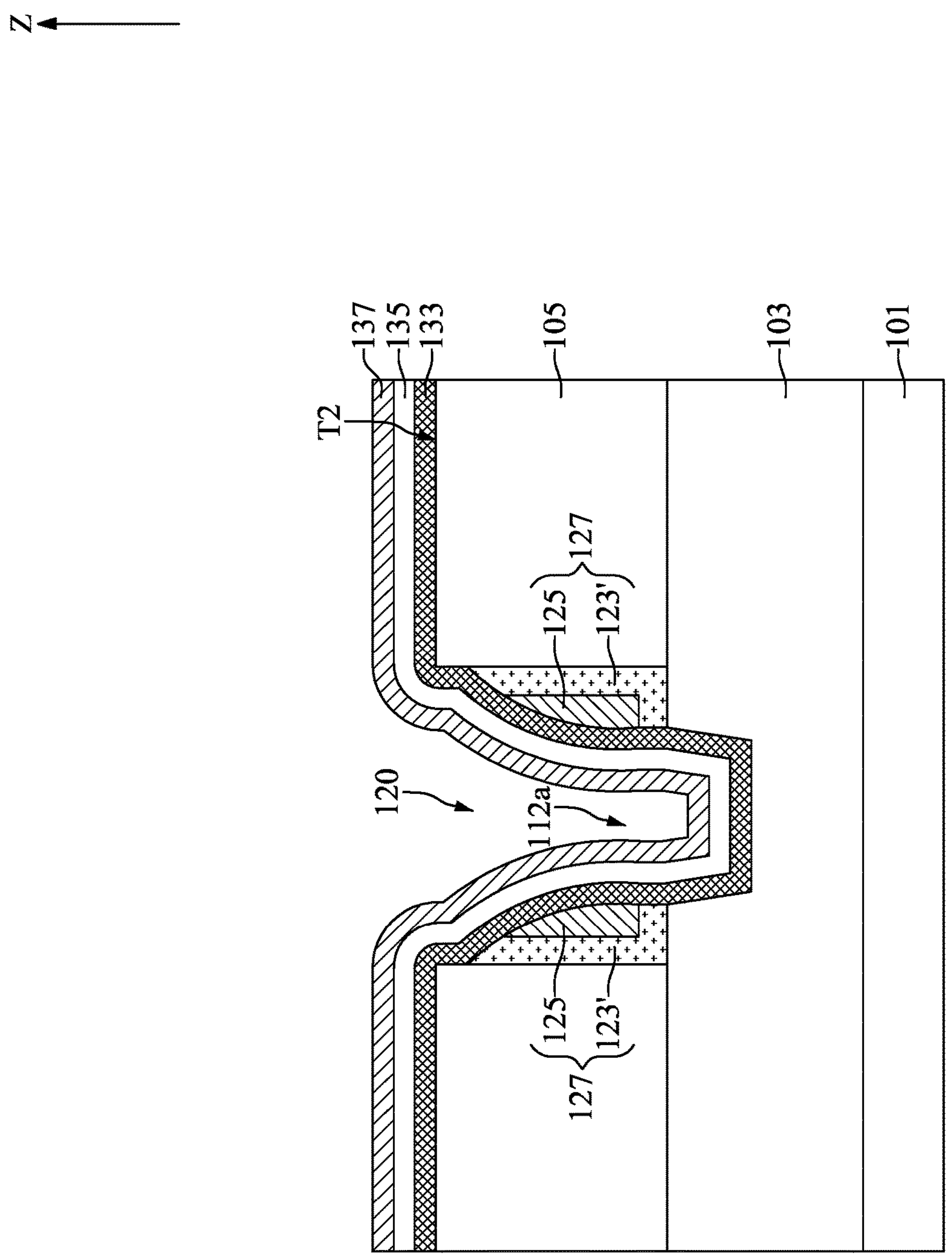

Subsequently, a metal layer 137 is conformally formed over the barrier layer 135, as shown in FIG. 14 in accordance with some embodiments. In some embodiments, the metal layer 137 further extends over the top surface T2 of the second dielectric layer 105. In some embodiments, the metal layer 137 includes copper-containing alloy, such as copper-manganese (Cu—Mn) alloy. However, any other suitable materials, such as aluminum (Al), tungsten (W), titanium (Ti), tantalum (Ta), gold (Au), silver (Ag), may be utilized. Some processes used to form the metal layer 137 are similar to, or the same as those used to form the barrier layer 135 and details thereof are not repeated herein.

Figure 15:
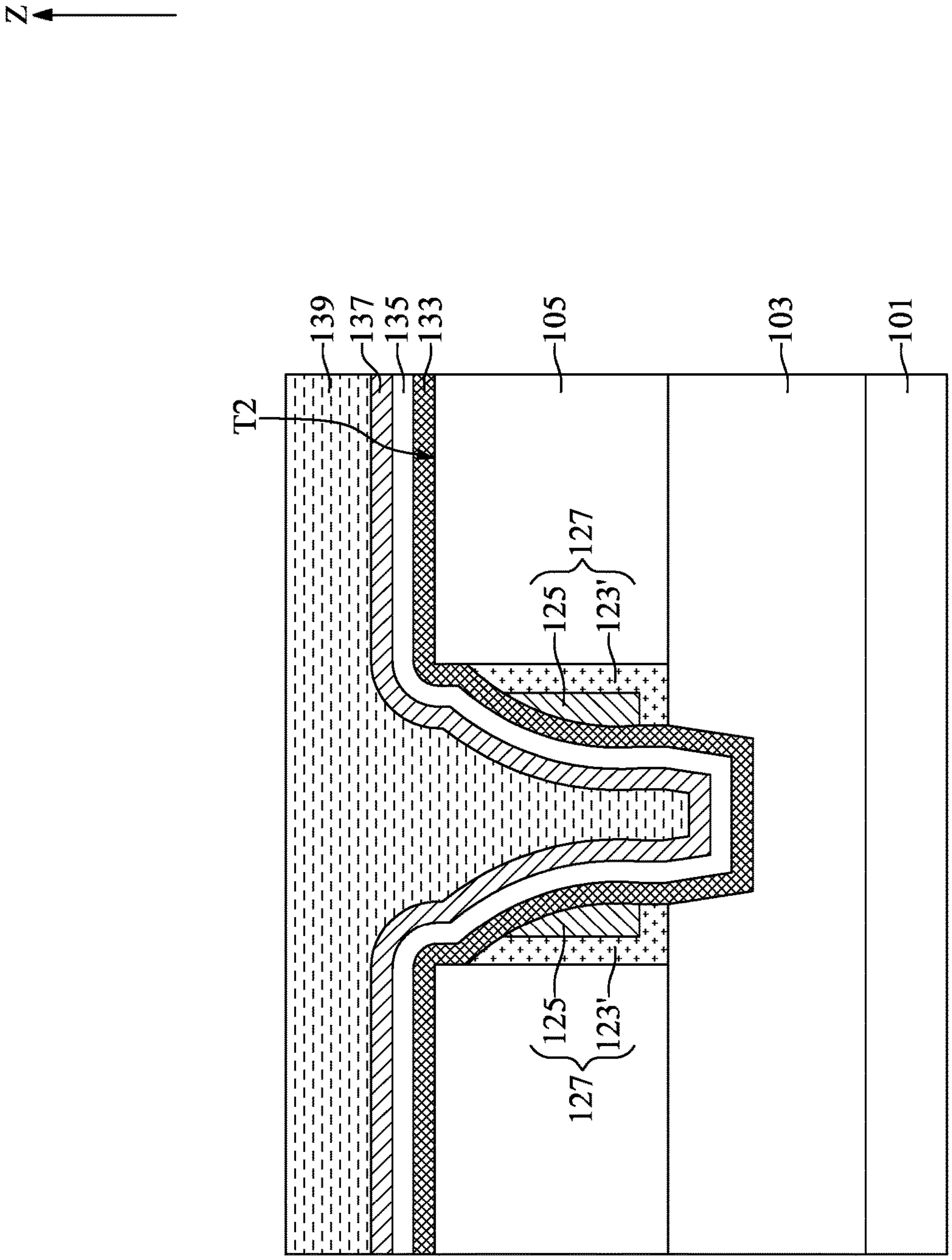

Then, a remaining portion of the enlarged upper opening 120 and a remaining portion of the lower opening 112*a* (if any) are filled by a metal filling portion 139, as shown in FIG. 15 in accordance with some embodiments. In some embodiments, the metal filling portion 139 further extends over the top surface T2 of the second dielectric layer 105. In some embodiments, the metal filling portion 139 includes copper (Cu). However, any other suitable materials, such as aluminum (Al), tungsten (W), titanium (Ti), tantalum (Ta), gold (Au), silver (Ag), may be utilized. Some processes used to form the metal filling portion 139 are similar to, or the same as those used to form the barrier layer 135 and details thereof are not repeated herein.

Figure 16:
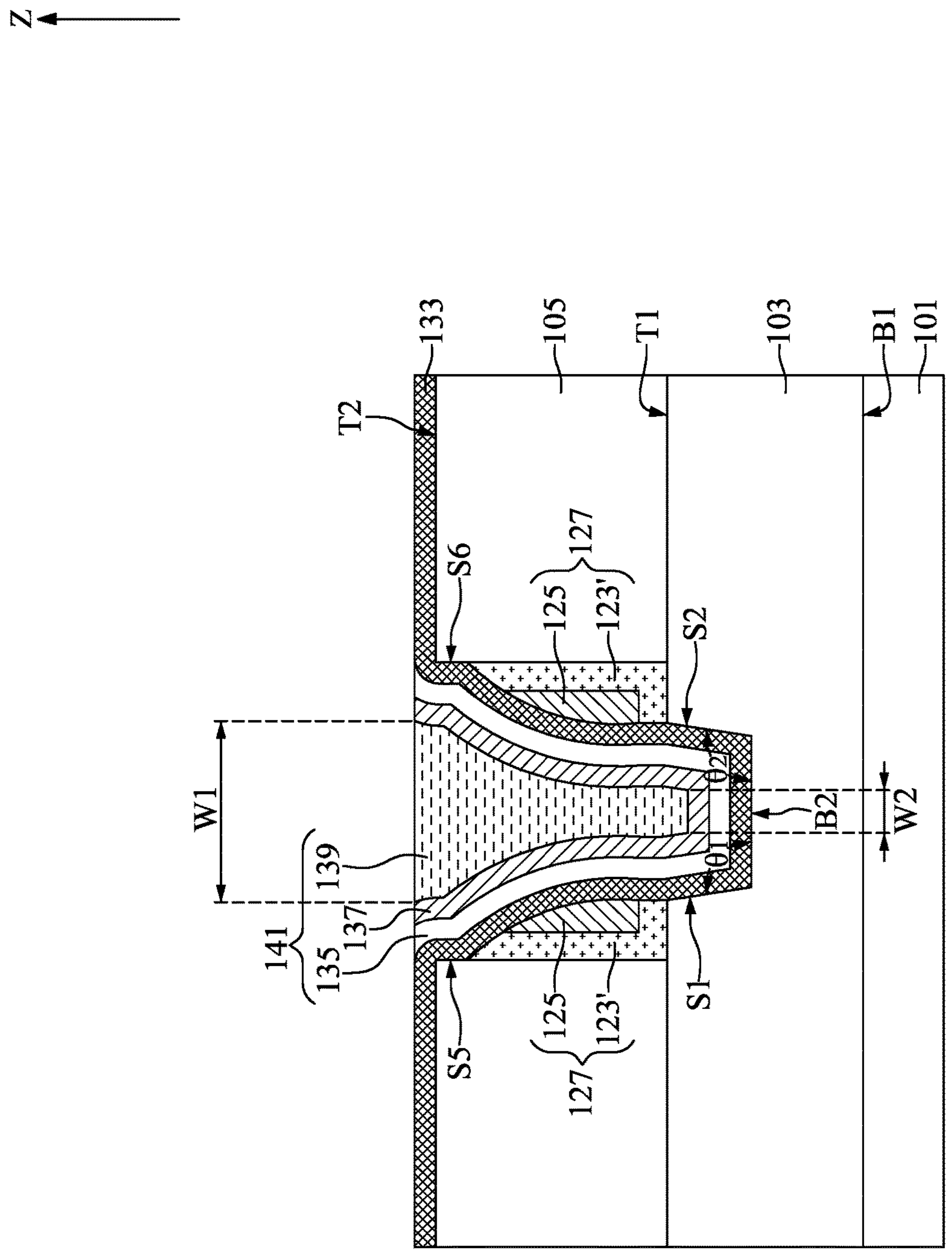
Figure 17:
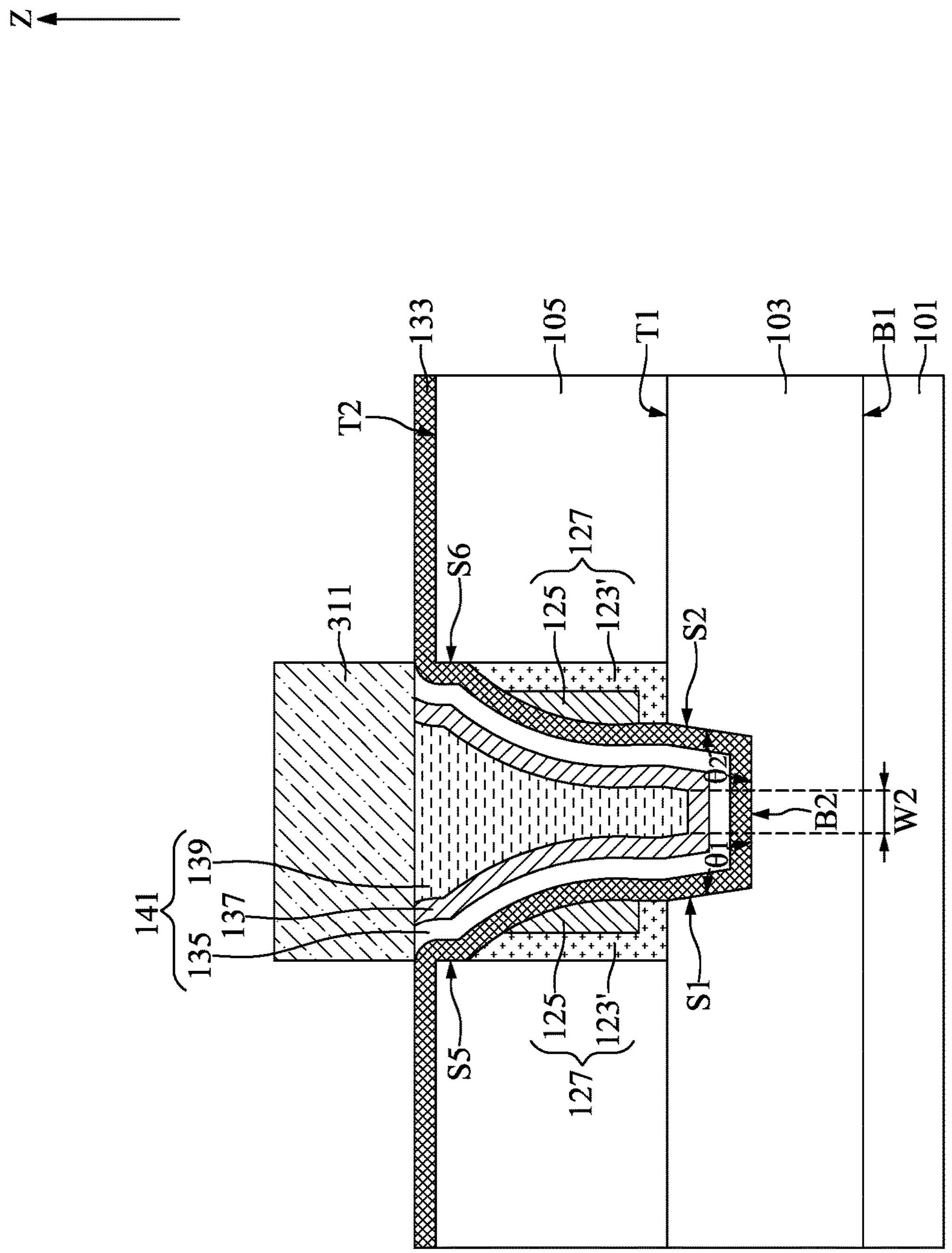

Next, a planarization process is performed on the metal filling portion 139, the metal layer 137, and the barrier layer 135 until the liner layer 133 is exposed, as shown in FIG. 16 in accordance with some embodiments. After the planarization process is performed, remaining portions of the metal filling portion 139, the metal layer 137, and the barrier layer 135 collectively form a conductive structure 141.

In some embodiments, the conductive structure 141 is surrounded by the liner layer 133 and the spacer structure 127. In some embodiments, the conductive structure 141 is separated from the second dielectric layer 105, the spacer structure 127, and the first dielectric layer 103 by the liner layer 133. The planarization process may include a chemical mechanical polishing (CMP) process. The respective step is illustrated as the step S25 in the method 10 shown in FIG. 4.

In some embodiments, the liner layer 133 of the semiconductor device structure 1A has tapered sidewalls S1 and S2 in direct contact with the first dielectric layer 103, which helps to improve the step coverage of the liner layer 133 and the conductive structure 141 over the liner layer 133. Moreover, adequate step coverage of the conductive structure 141 can reduce electromigration. Furthermore, the porous low-k dielectric layer 125 of the spacer structure 127 can reduce the resistive-capacitive (RC) delay in signal propagation. As a result, performance and reliability of the semiconductor device structure can be improved.

Next, a pattern mask 311 is formed to cover the conductive structure 141, in accordance with some embodiments. In some embodiments, the pattern mask 311 and the liner layer 133 include different materials so that the etching selectivity may be different in the subsequent etching process. In some embodiments, the pattern mask 311 and second dielectric layer 105 include different materials so that the etching selectivity may be different in the subsequent etching process.

Figure 18:
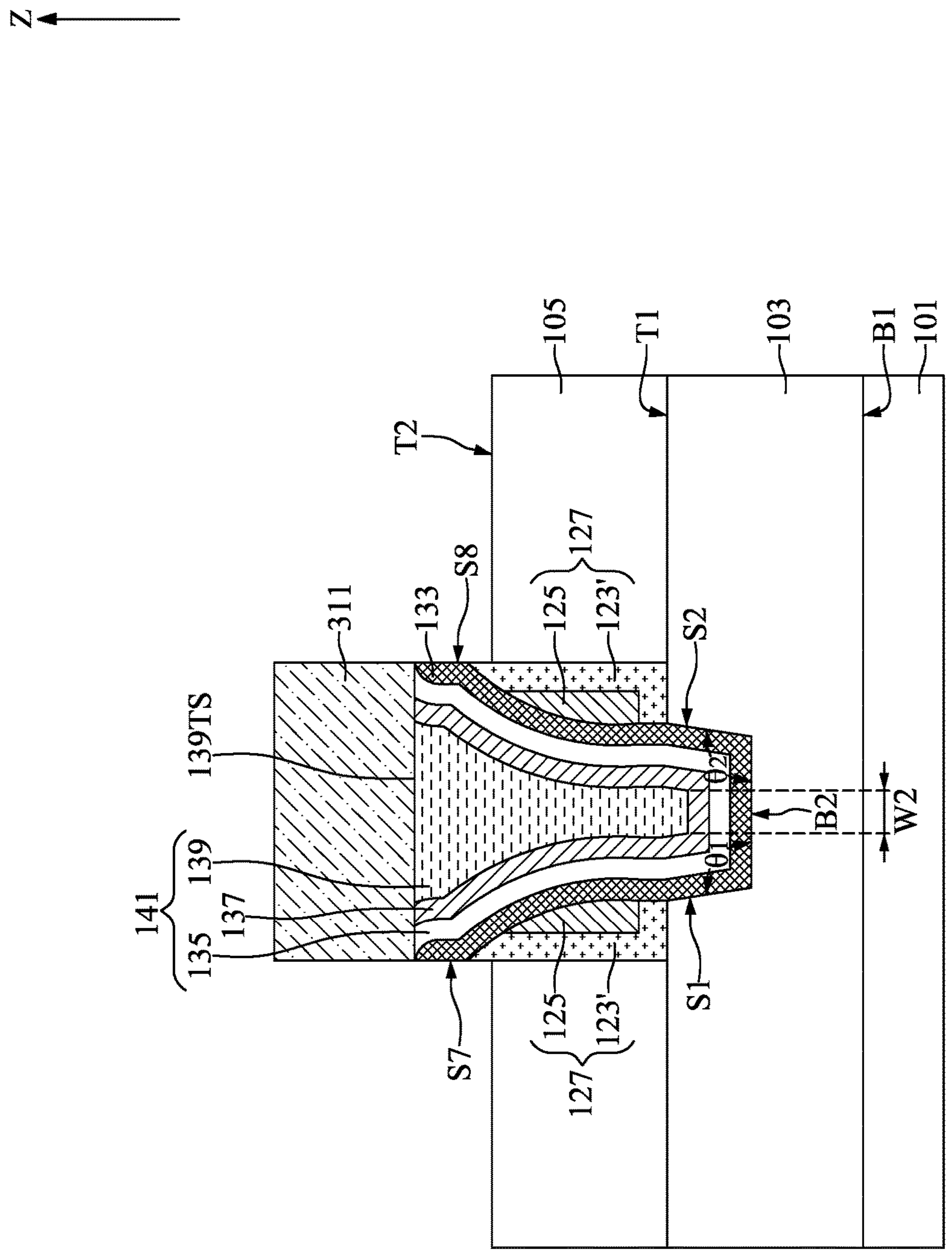

Subsequently, an etching process (also referred to as a fourth etching process) is performed using the pattern mask 311 as a mask, such that portions of the liner layer 133 and the second dielectric layer 105 are removed, as shown in FIG. 18 in accordance with some embodiments. The top surface T2 of the second dielectric layer 105 is recessed. The exposed sidewalls of the liner layer 133 are referred to as sidewalls S7 and S8. In some embodiments, the top surface T2 is lower than the top surface 139TS of the metal filling portion 139. In some embodiments, the top surface T2 of the second dielectric layer 105 is recessed to partially expose the L-shaped liner 123'. In some embodiments, the L-shaped liner 123' is still covered by the second dielectric layer 105 after the recessing of the second dielectric layer 105. The respective step is illustrated as the step S27 in the method 10 shown in FIG. 4. In some embodiments, the fourth etching process includes a dry etching process such as an anisotropic dry etching process. The pattern mask 311 is removed after the top surface T2 of the second dielectric layer 105 is recessed.

Figure 19:
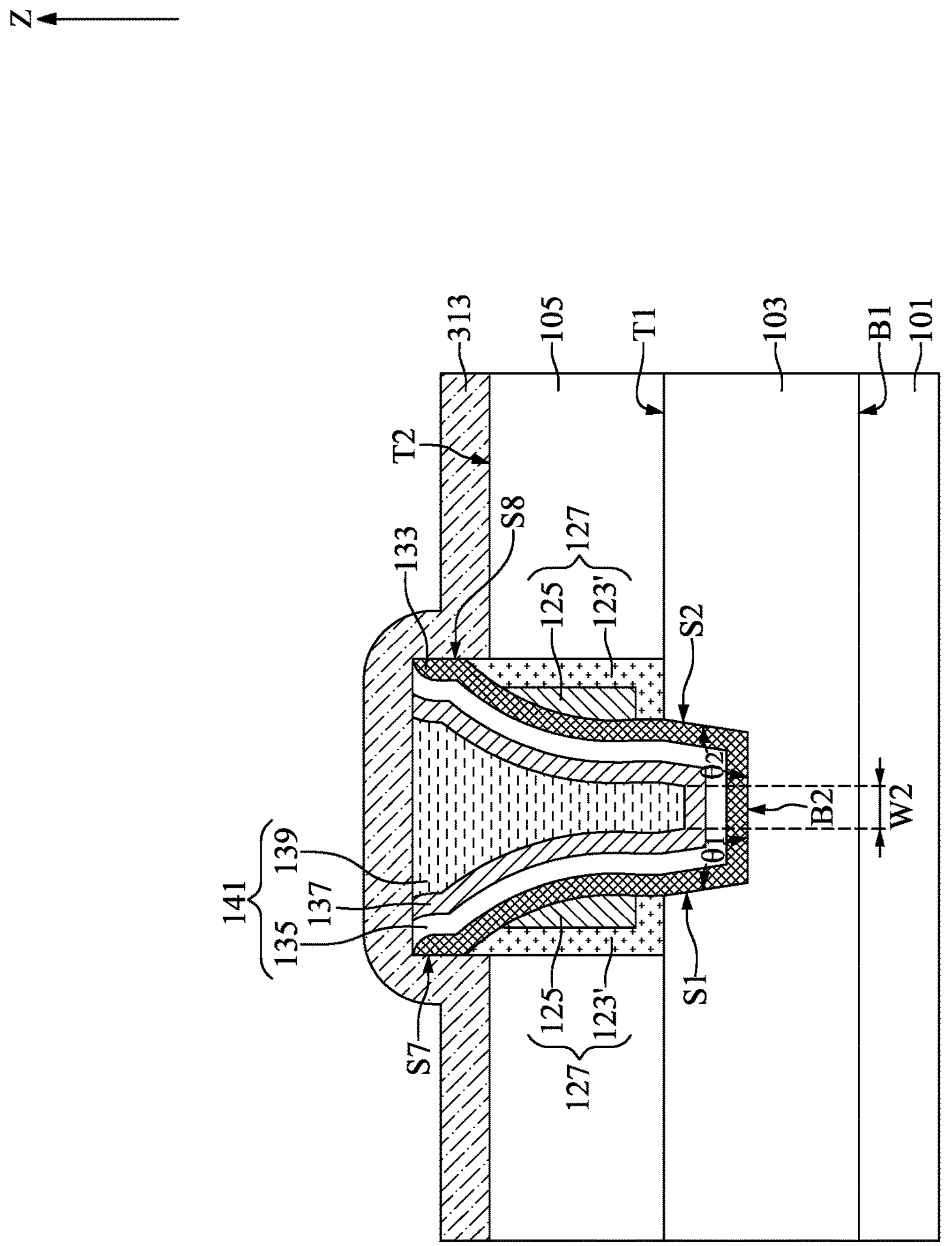

Next, a silicon layer 313 is conformally deposited over and in direct contact with the second dielectric layer 105, the conductive structure 141, the liner layer 133, and the L-shaped liner 123', as shown in FIG. 19 in accordance with some embodiments. The respective step is illustrated as the step S29 in the method 10 shown in FIG. 4. In some embodiments, the top surface T2 of the second dielectric layer 105, the sidewalls S7 and S8 of the liner layer 133, the upper portions of the L-shaped liner 123', and the top surface of the conductive structure 141 are covered by the silicon layer 313. In some embodiments, the silicon layer 313 is formed by a CVD process, a PVD process, an ALD process, a spin-on coating process, or another applicable process.

Figure 20:
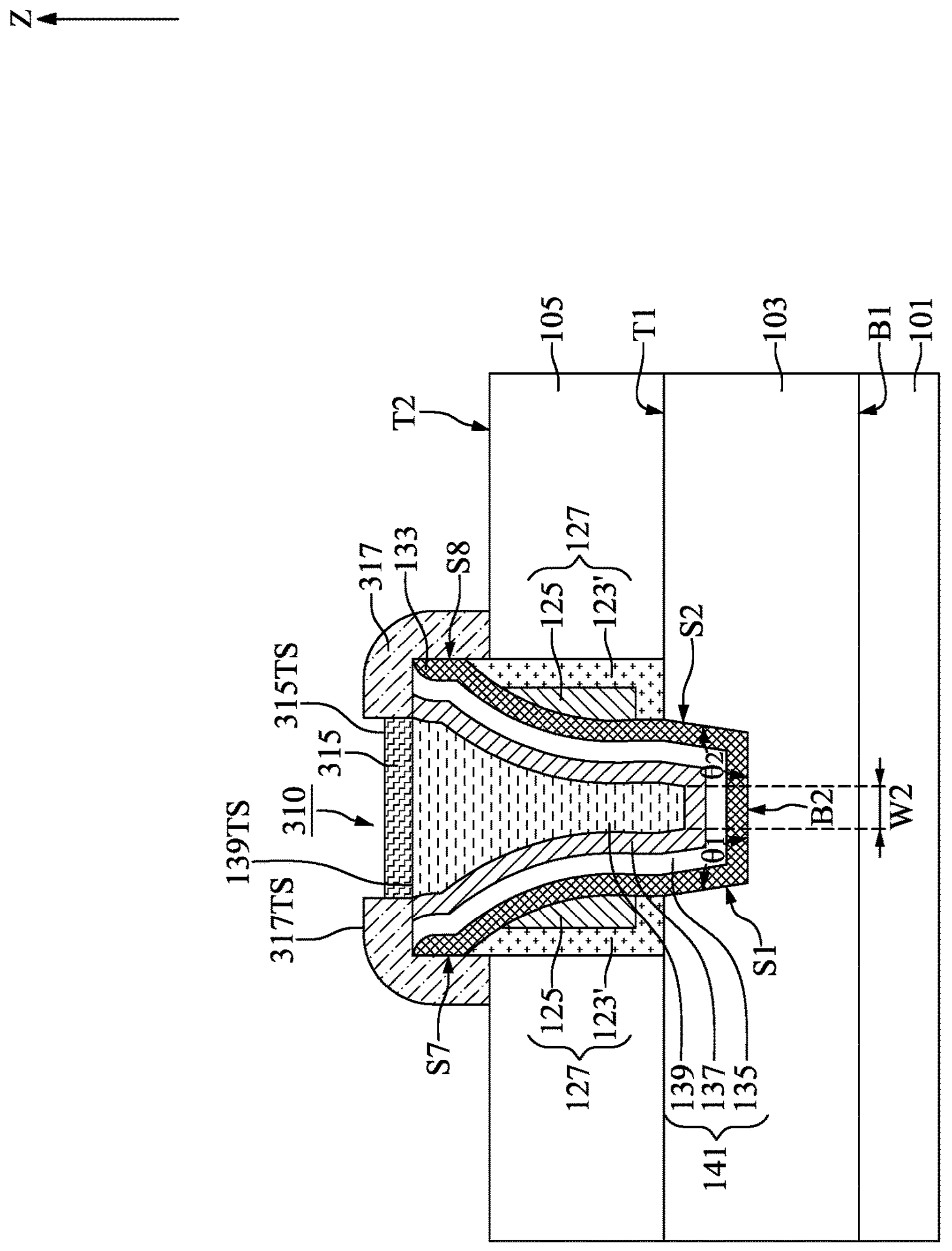

After the silicon layer 313 is deposited, a salicide (i.e., self-aligned silicide) process is performed to form the inner silicide portion 315 over the metal filling portion 139 and the outer silicide portion 317 over the metal layer 137, the barrier layer 135, the liner layer 133, and the L-shaped liner 123', as shown in FIG. 20 in accordance with some embodiments. The respective step is illustrated as the step S31 in the method 10 shown in FIG. 4.

In the present embodiment, the salicide process is performed to grow silicides on exposed surfaces. In more detail, in the embodiment shown, the inner silicide portion 315 and the outer silicide portion 317 are formed by reacting the conductive structure 141, the liner layer 133, and the L-shaped liner 123' with the silicon layer 313, annealing and etching to remove the unreacted portions of the silicon layer 313. Referring to FIG. 20, the inner silicide portion 315 is grown on the top surface 139TS of the metal filling portion 139, and the outer silicide portion 317 is grown covering the top surfaces of the metal layer 137, the barrier layer 135, the liner layer 133, the sidewalls S7 and S8 of the liner layer 133, and the upper portion of the L-shaped liner 123', in accordance with some embodiments.

Moreover, in some embodiments, the material of the metal filling portion 139 is selected such that the metal layer 137, the barrier layer 135, and the liner layer 133 exhibit a greater silicidation rate than the metal filling portion 139. Therefore, the outer silicide portion 317 is grown faster than the inner silicide portion 315. In some embodiments, after the salicide process, the top surface 317TS of the outer silicide portion 317 is greater than the top surface 315TS of the inner silicide portion 315. In some embodiments, the metal layer 137 and the barrier layer 135 are made of a titanium-containing material, and the outer silicide portion 317 is made of a titanium-containing silicide.

In some embodiments, the inner silicide portion 315 is surrounded by the outer silicide portion 317, and a recess 310 is formed over the inner silicide portion 315 and surrounded by the outer silicide portion 317. In addition, the outer silicide portion 317 is in direct contact with the top surface T2 of the second dielectric layer 105, in accordance with some embodiments. Since the inner silicide portion 315 and the outer silicide portion 317 are formed by the salicide (self-aligned silicide) process, the associated costs may be reduced.

Figure 21:
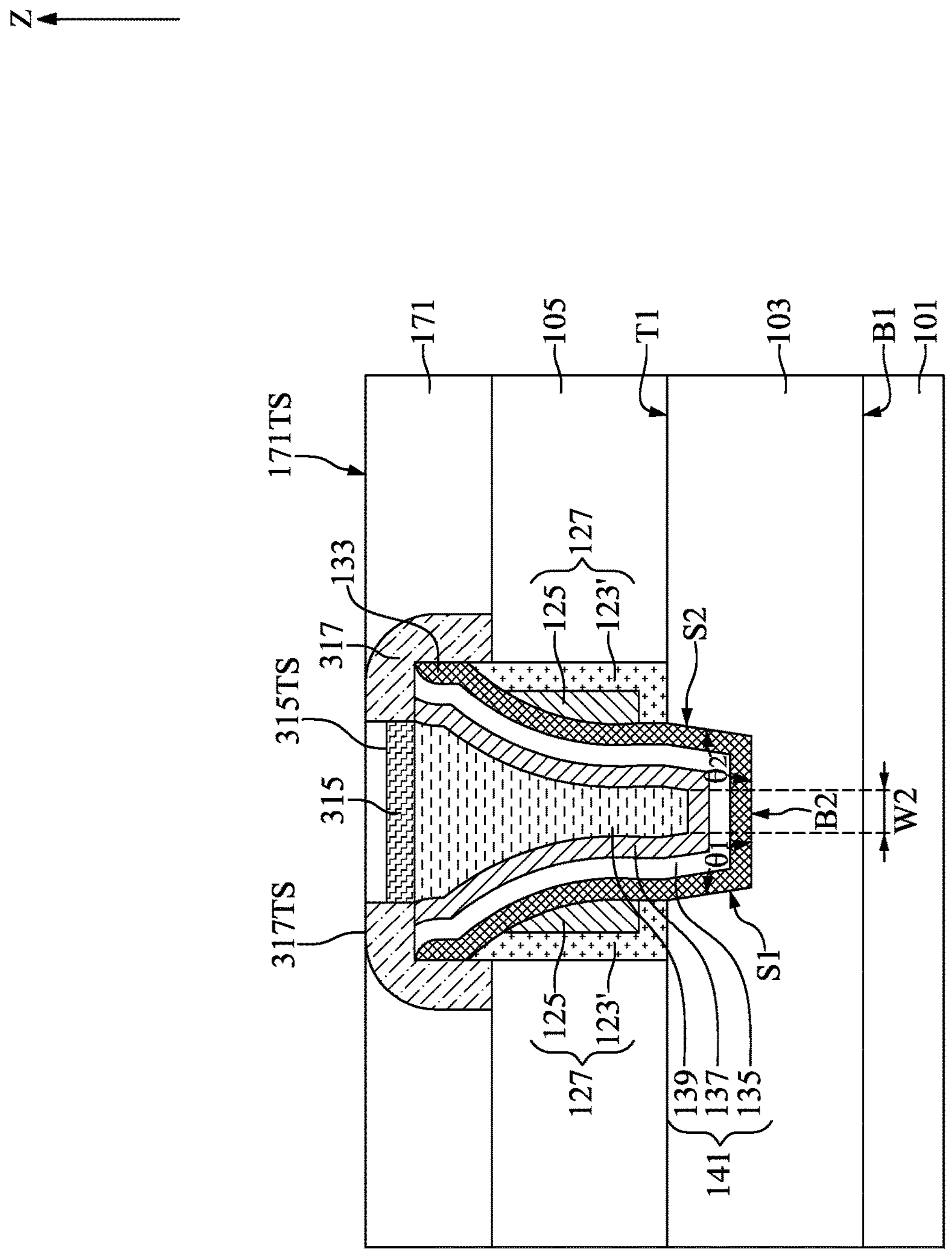

Next, a third dielectric layer 171 is deposited over the second dielectric layer 105, and the inner silicide portion 315 and the outer silicide portion 317 are covered by the third dielectric layer 171, as shown in FIG. 21 in accordance with some embodiments. A planarization process is performed until the top surface 317TS of the outer silicide portion 317 is exposed to provide a substantially flat surface for subsequent processes. Some materials and processes used to form the third dielectric layer 171 are similar to, or the same as, those used to form the first dielectric layer 103, and details thereof are not repeated herein. In some embodiments, the top surface 171TS of the third dielectric layer 171 and the top surface 317TS of the outer silicide portion 317 are substantially coplanar.

Next, a fourth dielectric layer 173 may be formed over the third dielectric layer 171. Some materials and processes used to form the fourth dielectric layer 173 are similar to, or the same as, those used to form the first dielectric layer 103, and details thereof are not repeated herein. Subsequently, an opening (not shown) is formed by performing an etching process similar to that illustrated in FIGS. 5 and 6. The inner silicide portion 315 and portions of the outer silicide portion 317 near the inner silicide portion 315 are exposed through the opening.

Next, an upper plug 319 is formed in the opening to directly contact the inner silicide portion 315 and the outer silicide portion 317, as shown in FIG. 1 in accordance with some embodiments. In some embodiments, the upper plug 319 is made of tungsten (W), aluminum (Al), copper (Cu), titanium (Ti), tantalum (Ta), a combination thereof, or another applicable metal material. The formation of the upper plug 319 may include a deposition process and a planarization process. The deposition process may be a CVD process, a PVD process, an ALD process, an MOCVD process, a sputtering process, a plating process, or another applicable process. The planarization process may include a CMP process. The respective step is illustrated as the step S33 in the method 10 shown in FIG. 4.

Figure 22:
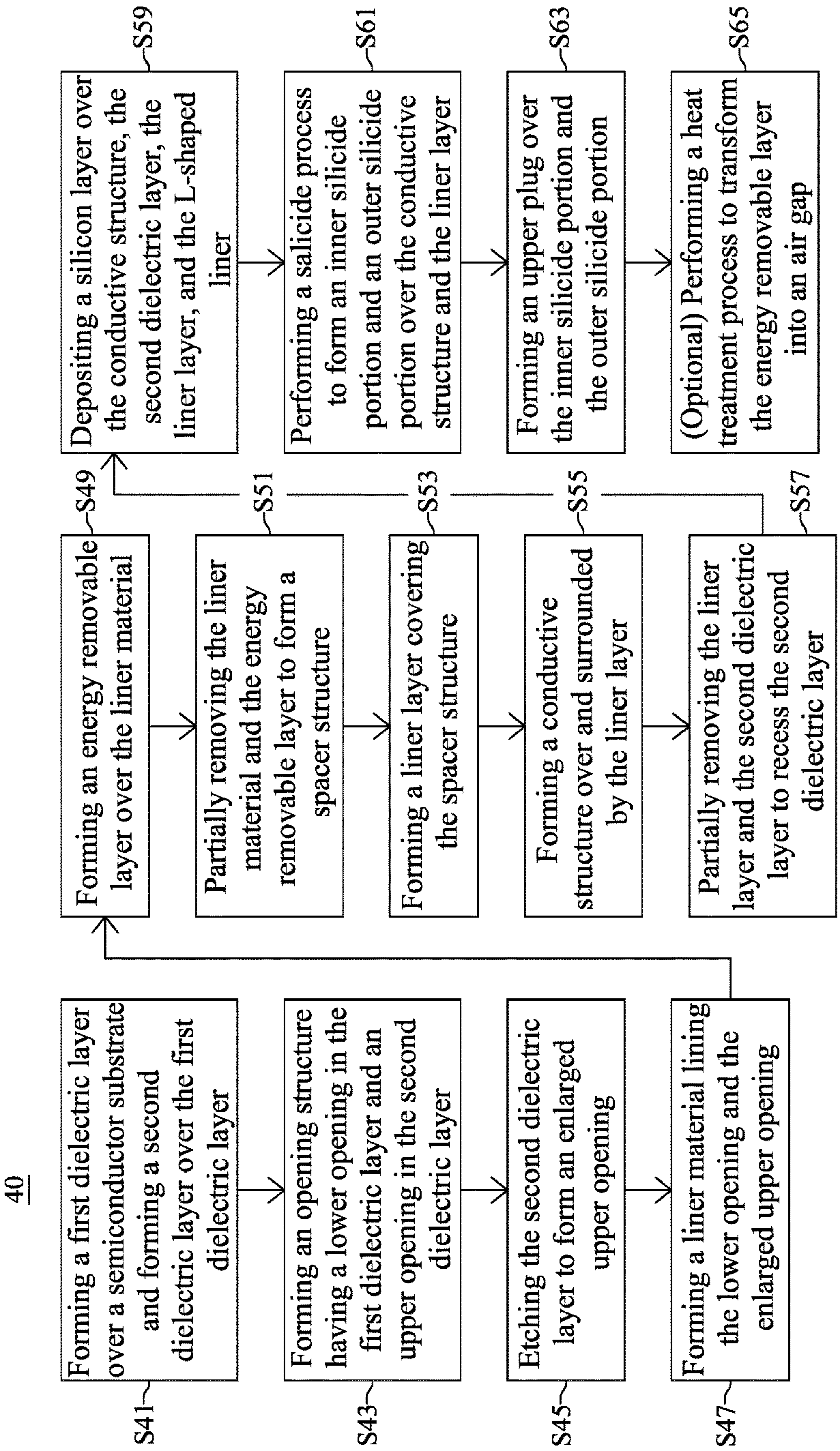
FIG. 22 is a flow diagram illustrating a method for preparing a semiconductor device structure, in accordance with another embodiment.

FIG. 22 is a flow diagram illustrating a method 40 for preparing the semiconductor device structures 1B and 1C, and the method 40 includes steps S41, S43, S45, S47, S49, S51, S53, S55, S57, S59, S61, S63, and S65, in accordance with some embodiments. The steps S41 to S65 of FIG. 22 are elaborated in connection with the following figures, such as FIGS. 23 and 24. The step S65 of performing a heat treatment process is optional. In the embodiments for forming the semiconductor device structure 1B, the structure of the semiconductor device structure 1B shown in FIG. 2 is obtained after the step S63, and the step S65 may be omitted. In the embodiments for forming the semiconductor device structure 1C, the structure of the semiconductor device structure 1C shown in FIG. 3 is obtained after the step S65.

Figure 23:
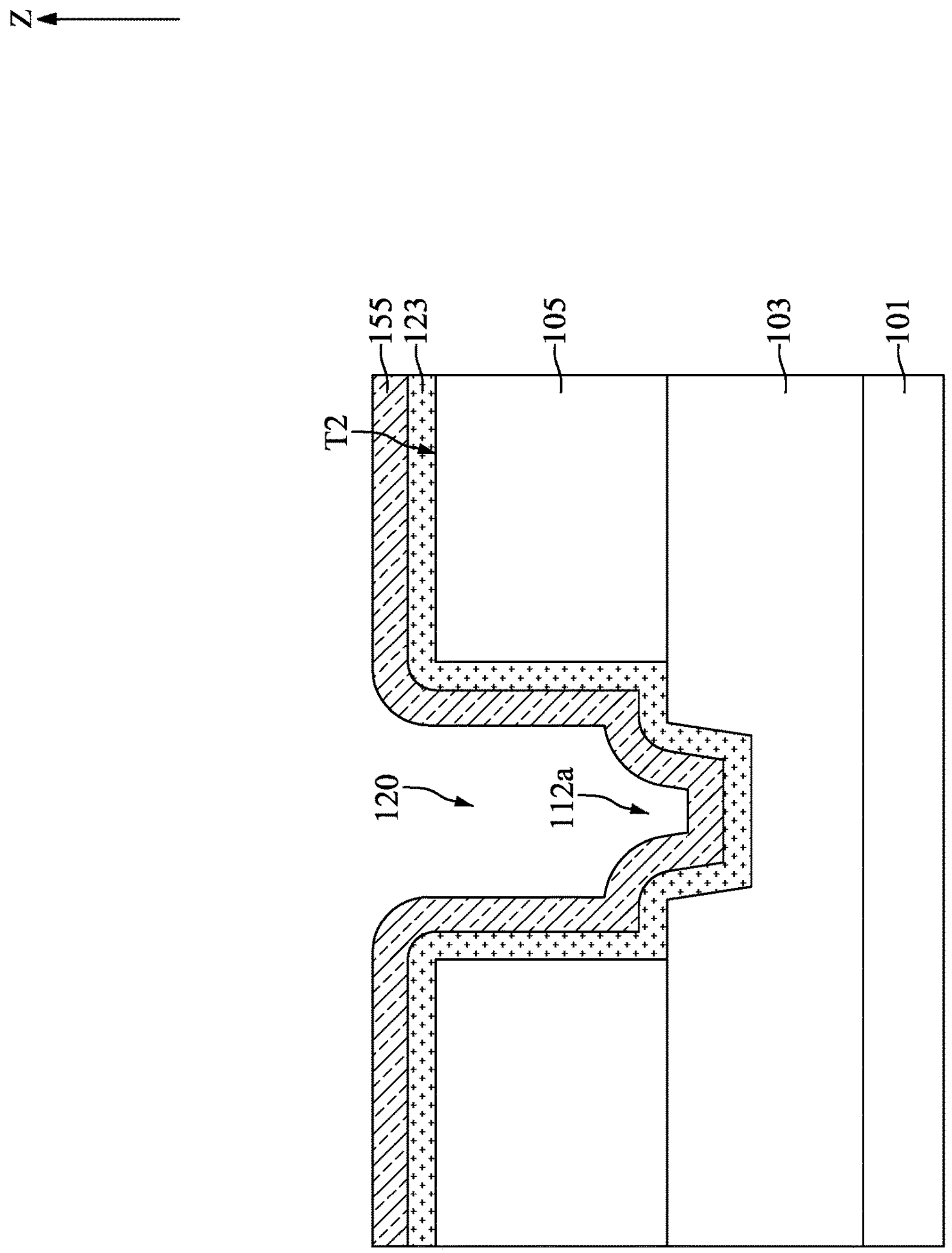
FIGS. 23 and 24 are cross-sectional views illustrating a flow for fabricating a semiconductor device structure in accordance with another embodiment.
Figure 24:
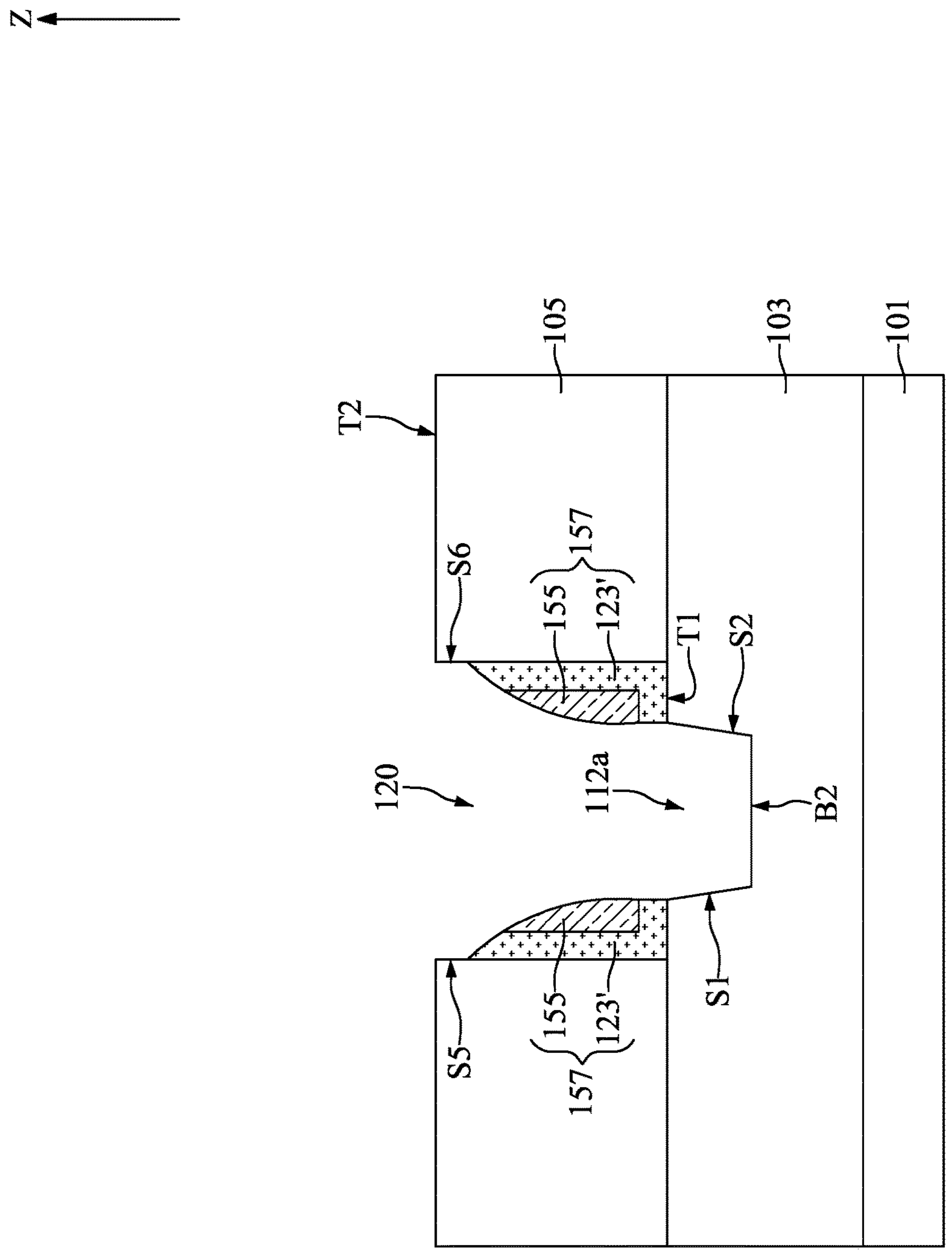

FIGS. 23 and 24 are cross-sectional views illustrating intermediate stages of forming the semiconductor device structures 1B and 1C, in accordance with some embodiments. It should be pointed out that operations for forming the semiconductor device structures 1B and 1C before the structure shown in FIG. 23 are substantially the same as the operations for forming the semiconductor device structure 1A shown in FIGS. 5 to 9 (The steps S41 to S47 in the method 40 shown in FIG. 22 are the same as the steps S11 to S17 in the method 10 shown in FIG. 4), and the related detailed descriptions may refer to the foregoing paragraphs and are not discussed again herein.

After the liner material 123 is formed lining the lower opening 112*a* and the enlarged upper opening 120, an energy removable layer 155 is formed over the liner material 123, as shown in FIG. 23 in accordance with some embodiments. The respective step is illustrated as the step S49 in the method 40 shown in FIG. 22. In some embodiments, the energy removable layer 155 is conformally formed over the structure of FIG. 9. In some embodiments, the energy removable layer 155 extends over the top surface T2 of the second dielectric layer 105.

In some embodiments, the energy removable layer 155 includes a thermal decomposable material. In some other embodiments, the energy removable layer 155 includes a photonic decomposable material, an e-beam decomposable material, or another suitable energy decomposable material. In some embodiments, the energy removable material includes a base material and a decomposable porogen material that is substantially removed once being exposed to an energy source (e.g., heat). In this case, the base material may include hydrogen silsesquioxane (HSQ), methylsilsesquioxane (MSQ), porous polyarylether (PAE), porous SiLK, or porous silicon oxide ($SiO_2$), and the decomposable porogen material may include a porogen organic compound, which can provide porosity to the space originally occupied by the energy removable layer 155 in the subsequent processes. In addition, the depositing of the energy removable layer 155 may include a CVD process, a PVD process, an ALD process, a spin-on coating process, or another suitable process.

Subsequently, an etching process (also referred to as a fifth etching process) is performed to partially remove the liner material 123 and the energy removable layer 155, such that a spacer structure 157 including the remaining portions of the liner material 123 and the energy removable layer 155 is obtained, as shown in FIG. 24 in accordance with some embodiments. The respective step is illustrated as the step S51 in the method 40 shown in FIG. 22. In some embodiments, the remaining portion of the liner material 123 has an "L" shape, which is referred to as an L-shaped liner 123'.

In some embodiments, after the fifth etching process is performed, the sidewalls S5 and S6 of the enlarged upper opening 120 are partially exposed by the spacer structure 157, and the sidewalls S1, S2 and the bottom surface B2 of the lower opening 112*a* are exposed. In some embodiments, the exposed portions of the sidewalls S5 and S6 are above the spacer structure 157. In some embodiments, the top surface T2 of the second dielectric layer 105 is exposed after the spacer structure 157 is formed.

In some embodiments, the liner material 123 and the energy removable layer 155 are etched by an anisotropic etching process, which removes the same amount of the liner material 123 and the energy removable layer 155 vertically in all places, leaving the spacer structure 157 on the lower portions of the sidewalls S5 and S6 of the second dielectric layer 105. In some embodiments, the third etching process is a dry etching process, such as plasma etching, RIE, NBE, or the like.

Then, the liner layer 133, the inner silicide portion 315, the outer silicide portion 317, the third dielectric layer 171, the fourth dielectric layer 173, and the upper plug 319 are formed with a procedure similar to that illustrated in FIGS. 12 to 21, and descriptions thereof are not repeated herein. After the upper plug 319 is formed, the semiconductor device structure 1B is obtained as shown in FIG. 2. In the semiconductor device structure 1B, the energy removable layer 155 of the spacer structure 157 is enclosed by the L-shaped liner 123' and the liner layer 133.

After the semiconductor device structure 1B is obtained, a heat treatment process can be performed to transform the energy removable layer 155 of the spacer structure 157 into an air gap 160, as shown in FIG. 3 in accordance with some embodiments. The respective step is illustrated as the step S65 in the method 40 shown in FIG. 22. It should be noted that the step S65 is optional.

In some embodiments, the temperature used in the heat treatment process may be high enough to efficiently burn-out the energy removable layer 155, leaving the air gap 160 in the spacer structure 167. After the air gap 160 of the spacer structure 167 is formed, the semiconductor device structure 1C is obtained. In the semiconductor device structure 1C, the air gap 160 of the spacer structure 167 is enclosed by the L-shaped liner 123' and the liner layer 133.

In the embodiments of the semiconductor device structures 1B and 1C, the liner layer 133 has tapered sidewalls S1 and S2 in direct contact with the first dielectric layer 103, which helps to improve the step coverage of the liner layer 133 and the conductive structure 141 over the liner layer 133. Moreover, adequate step coverage of the conductive structure 141 can reduce electromigration. Furthermore, the energy removable layer 155 of the spacer structure 157 and the air gap 160 of the spacer structure 167 can reduce RC delay in signal propagation. As a result, performance and reliability of the semiconductor device structure can be improved.

Embodiments of the semiconductor device structure and method for preparing the same are provided in the disclosure. In some embodiments, the semiconductor device structure includes a first dielectric layer (e.g., the first dielectric layer 103) and a second dielectric layer (e.g., the second dielectric layer 105) disposed over the first dielectric layer, and a conductive structure (e.g., the conductive structure 141 including the barrier layer 135, the metal layer 137, and the metal filling portion 139) penetrating through the second dielectric layer and extending into the first dielectric layer. In some embodiments, the conductive structure is separated from the first dielectric layer by a liner layer (e.g., the liner layer 133), and the liner layer has tapered sidewalls (e.g., the sidewalls S1 and S2) in direct contact with the first dielectric layer.

Since the opening in the first dielectric layer (e.g., the lower opening 112*a*) has tapered sidewalls for the liner layer to line on, the conformity (i.e., the step coverage) of the liner layer can be improved, and the step coverage of the conductive structure disposed over the liner layer can also be improved. Adequate step coverage of the conductive structure can reduce electromigration. As a result, performance and reliability of the semiconductor device structure can be improved.

In addition, the inner silicide portion 315 and the outer silicide portion 317 constitute a composite landing pad with an increased landing area for the upper plug 319 to land on. Therefore, the contact resistance may be reduced, and the misalignment issues between the lower conductive structure 141 and the upper plug 319 may be prevented or reduced. As a result, the overall device performance may be improved, and the yield rate of the semiconductor device structure may be increased.

FIGS. 25 to 28 are cross-sectional views illustrating the fabrication of a semiconductor device structure 1D, in accordance with some embodiments.

Figure 25:
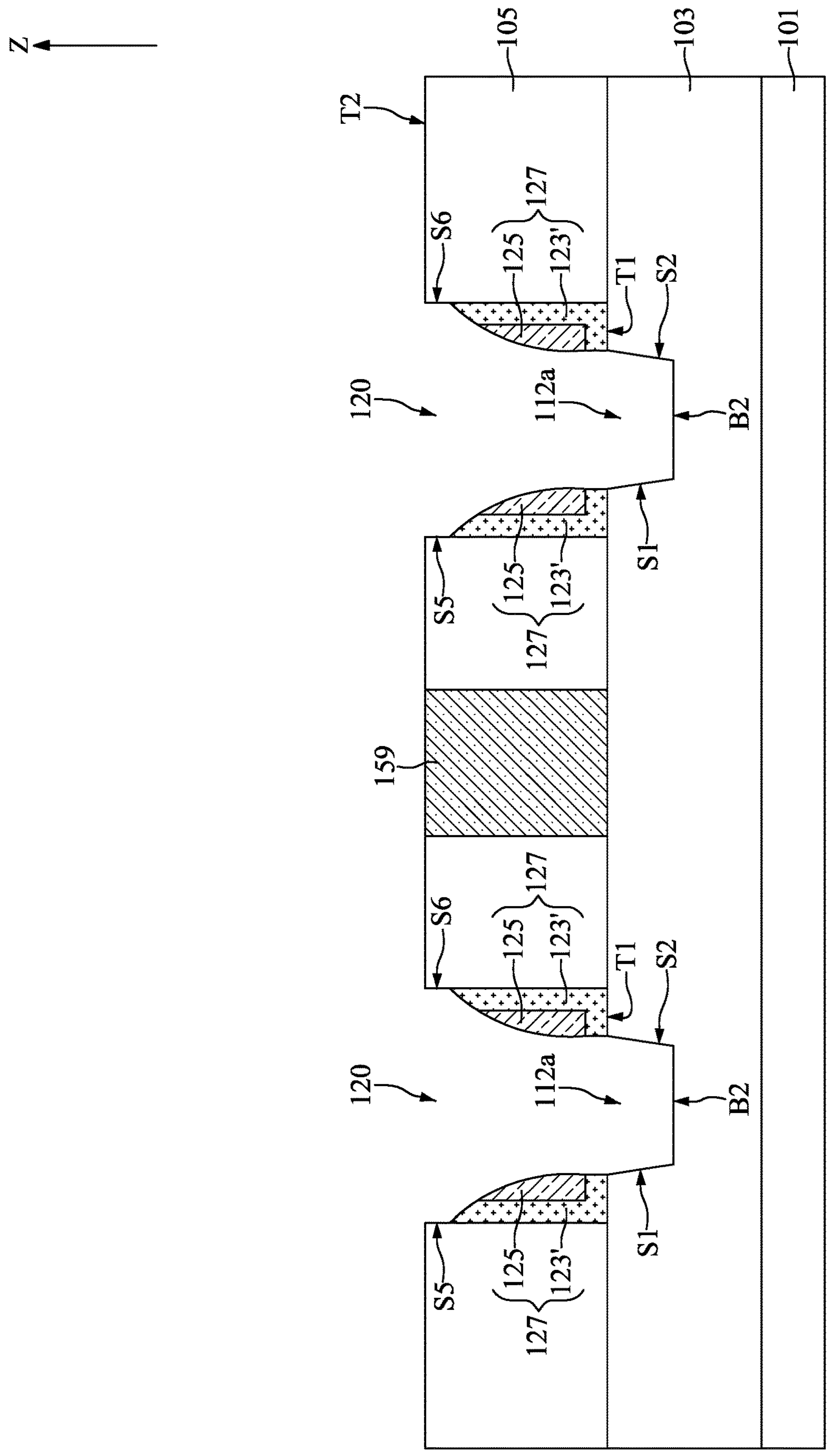
FIGS. 25 to 28 are cross-sectional views illustrating a flow for fabricating a semiconductor device structure in accordance with another embodiment.

As shown in FIG. 25, an intermediate semiconductor device may be fabricated with a procedure similar to that illustrated in FIGS. 5 to 11, and descriptions thereof are not repeated herein. An energy removable layer 159 is formed in the second dielectric layer 105 and between two adjacent intermediate structures as shown in FIG. 11. An opening (not shown) is forming between the two adjacent intermediate structures shown in FIG. 11. The energy removable layer 159 is deposited to fill the opening with a procedure similar to that illustrated in FIG. 23, and descriptions thereof are not repeated herein. The enlarged upper openings 120 may be masked during the formation of the energy removable layer 159.

Figure 26:
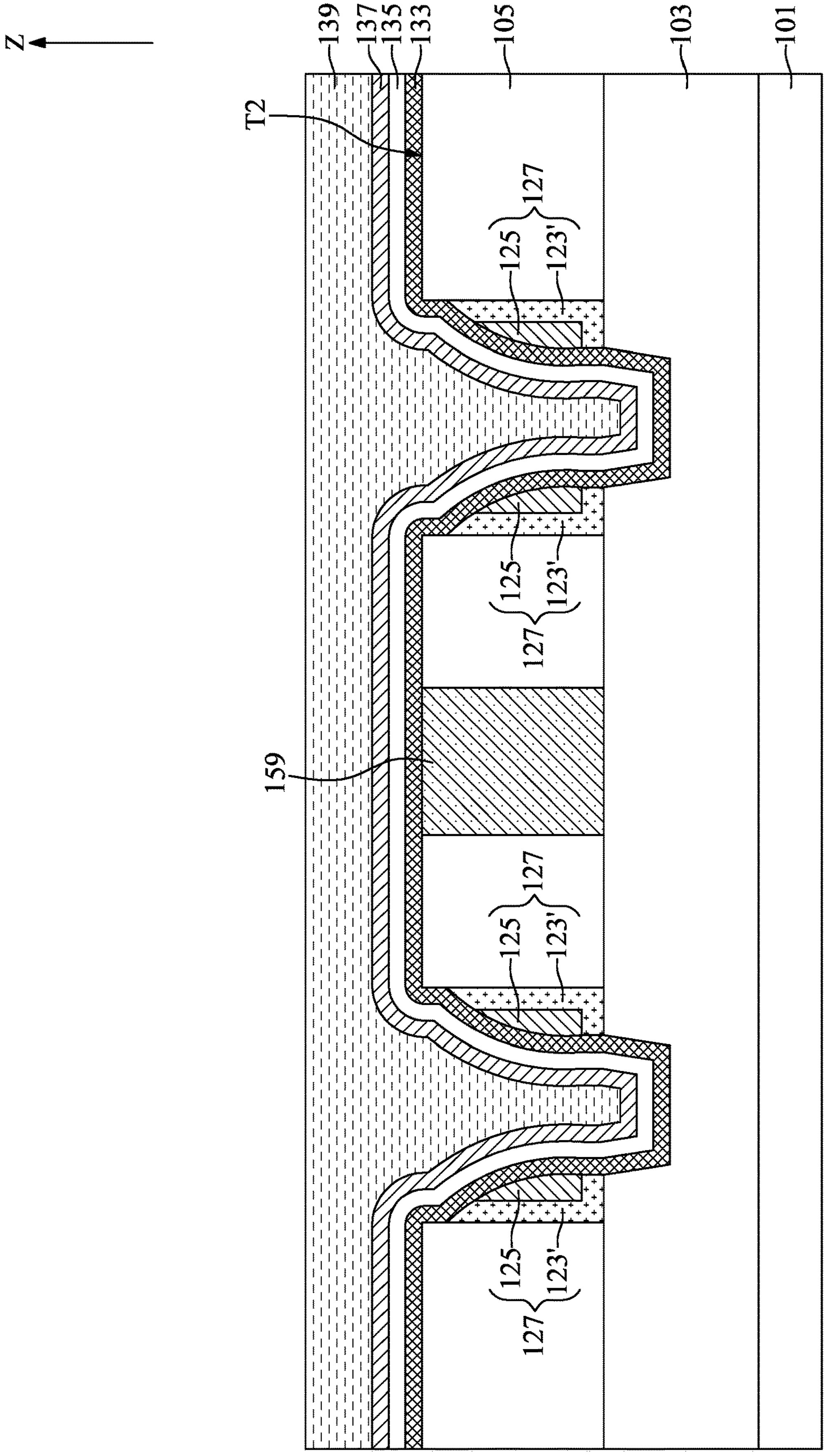

As shown in FIG. 26, the liner layer 133 may be formed to the cover the energy removable layer 159. The liner layer 133, the porous low-k dielectric layer 125, the metal layer 137, and the metal filling portion 139 are formed with a procedure similar to that illustrated in FIGS. 12 to 15, and descriptions thereof are not repeated herein.

Figure 27:
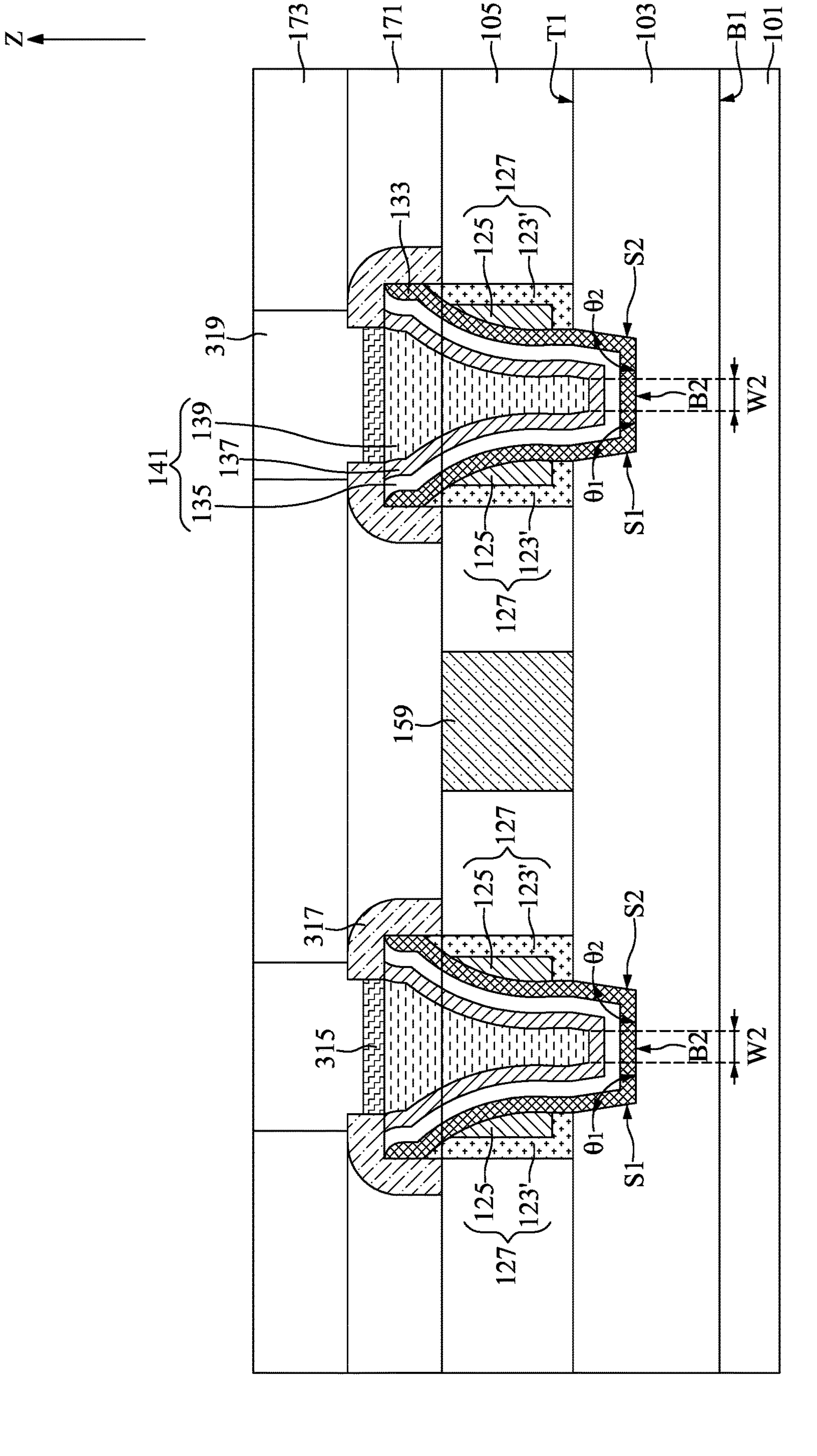

As shown in FIG. 27, the conductive structure 141, the inner silicide portion 315, the outer silicide portion 317, the third dielectric layer 171, the fourth dielectric layer 173, and the upper plug 319 are formed with a procedure similar to that illustrated in FIGS. 16 to 21, and descriptions thereof are not repeated herein.

Figure 28:
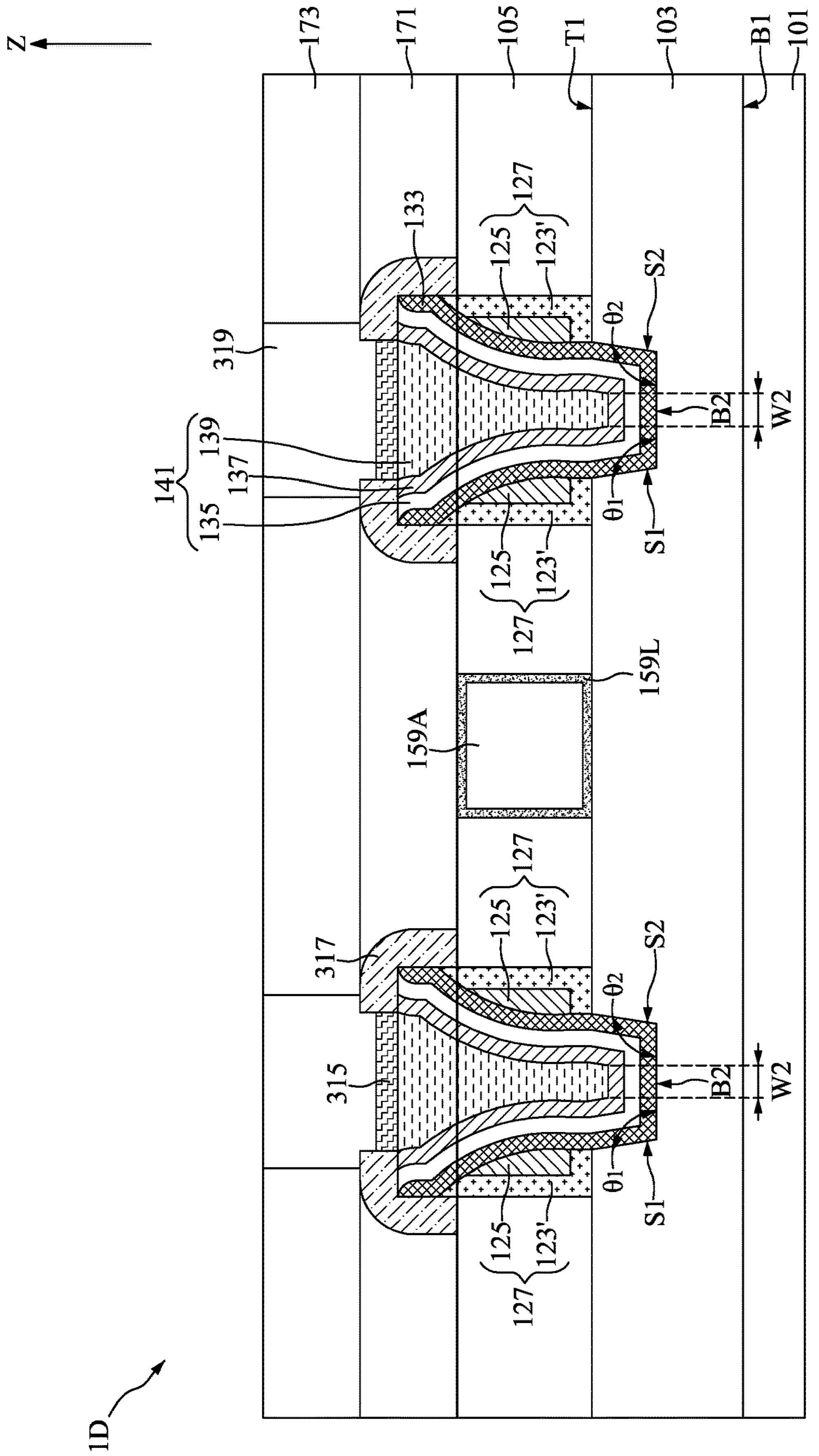

As shown in FIG. 28, a heat treatment process similar to that illustrated at the step S65 in the method 40 shown in FIG. 5 is performed, and descriptions thereof are not repeated herein. In some embodiments, during the heat treatment process, the remaining energy removable block is transformed into an air gap structure including an air gap 159A enclosed by a liner 159L. After the air gap 159A is formed, the semiconductor device structure 1D is obtained. By employing the air gap 159A between adjacent conductive features (e.g., the conductive structures 141 and the upper plugs 319), the parasitic capacitance between the conductive features can be reduced. As a result, performance and reliability of the semiconductor device structure can be improved.

One aspect of the present disclosure provides a semiconductor device including a first dielectric layer disposed over a semiconductor substrate; a second dielectric layer disposed over the first dielectric layer; a third dielectric layer disposed over the second dielectric layer; a spacer structure disposed in the second dielectric layer; a conductive structure disposed in the third dielectric layer, penetrating through the second dielectric layer, and extending into the first dielectric layer, wherein the conductive structure is surrounded by the spacer structure; a liner layer separating the conductive structure from the first dielectric layer, the second dielectric layer, and the spacer structure, wherein the liner layer has a tapered sidewall in direct contact with the first dielectric layer; an inner silicide portion disposed over the conductive structure; an outer silicide portion surrounding the inner silicide portion and covering the liner layer; and an upper plug disposed over the inner silicide portion and the outer silicide portion.

One aspect of the present disclosure provides a semiconductor device including a first dielectric layer disposed over a semiconductor substrate; a second dielectric layer disposed over the first dielectric layer; a third dielectric layer disposed over the second dielectric layer; a conductive structure disposed in the third dielectric layer, penetrating through the second dielectric layer, and extending into the first dielectric layer; a liner layer surrounding the conductive structure, wherein the liner layer has a tapered sidewall in direct contact with the first dielectric layer; a spacer structure disposed between the liner layer and the second dielectric layer, wherein the spacer structure is in direct contact with a top surface of the first dielectric layer; an inner silicide portion disposed over the conductive structure; an outer silicide portion surrounding the inner silicide portion and covering the liner layer; and an upper plug disposed over the inner silicide portion and the outer silicide portion.

Another aspect of the present disclosure provides a method for fabricating a semiconductor device including forming a first dielectric layer over a semiconductor substrate; forming a second dielectric layer over the first dielectric layer; performing a first etching process to form an opening structure, wherein the opening structure has a tapered profile, and wherein the opening structure has a lower opening in the first dielectric layer and an upper opening in the second dielectric layer; performing a second etching process to laterally extend the upper opening of the opening structure, such that a top surface of the first dielectric layer is exposed by an enlarged upper opening; forming a spacer structure over the top surface of the first dielectric layer; forming a liner layer covering the spacer structure; forming a conductive structure over and surrounded by the liner layer; recessing a top surface of the second dielectric layer; forming an inner silicide portion over the conductive structure and an outer silicide portion surrounding the inner silicide portion and over the conductive structure and the liner layer; and forming an upper plug over the inner silicide portion and the outer silicide portion.

Due to the design of the semiconductor device of the present disclosure, the liner layer 133 including the tapered sidewall S1 and S2 in direct contact with the first dielectric layer 103, which helps to improve the step coverage of the liner layer 133 and the overlying conductive structure 141. Moreover, adequate step coverage of the conductive structure 141 can reduce electromigration (EM). As a result, performance and reliability of the semiconductor device structure 1A can be improved. In addition, the inner silicide portion 315 and the outer silicide portion 317 constitute a composite landing pad with an increased landing area for the upper plug 319 to land on. Therefore, the contact resistance may be reduced, and the misalignment issues between the lower conductive structure 141 and the upper plug 319 may be prevented or reduced. As a result, the overall device performance may be improved, and the yield rate of the semiconductor device structure 1A may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:

a first dielectric layer disposed over a semiconductor substrate;

a second dielectric layer disposed over the first dielectric layer;

a third dielectric layer disposed over the second dielectric layer;

a spacer structure disposed in the second dielectric layer;

a conductive structure disposed in the third dielectric layer, penetrating through the second dielectric layer, and extending into the first dielectric layer, wherein the conductive structure is surrounded by the spacer structure;

a liner layer separating the conductive structure from the first dielectric layer, the second dielectric layer, and the spacer structure, wherein the liner layer has a tapered sidewall in direct contact with the first dielectric layer;

an inner silicide portion disposed over the conductive structure;

an outer silicide portion surrounding the inner silicide portion and covering the liner layer; and an upper plug disposed over the inner silicide portion and the outer silicide portion;

wherein the conductive structure further comprises:

a barrier layer; and a metal filling portion disposed over and surrounded by the barrier layer, wherein the metal filling portion comprises copper (Cu), a metal layer disposed between the barrier layer and the metal filling portion, wherein the metal layer comprises copper-manganese (Cu—Mn) alloy.

2. The semiconductor device structure of claim 1, wherein the spacer structure is in direct contact with a top surface of the first dielectric layer.

3. The semiconductor device structure of claim 1, wherein an angle between the tapered sidewall and a bottom surface of the liner layer is greater than 90 degrees.

4. The semiconductor device structure of claim 1, wherein a top width of the metal filling portion is greater than a bottom width of the metal filling portion.

5. The semiconductor device structure of claim 1, wherein the spacer structure further comprises an L-shaped liner.

6. The semiconductor device structure of claim 5, wherein the spacer structure further comprises an air gap enclosed by the L-shaped liner and the liner layer.

7. The semiconductor device structure of claim 1, wherein a top surface of the outer silicide portion is higher than a top surface of the inner silicide portion.

8. The semiconductor device structure of claim 4, wherein a width of the upper plug is greater than the top width of the metal filling portion.

9. The semiconductor device structure of claim 1, wherein the outer silicide portion comprises titanium silicide.

10. The semiconductor device structure of claim 1, wherein the inner silicide portion comprises copper silicide.

11. The semiconductor device structure of claim 1, wherein the upper plug comprises tungsten (W), aluminum (Al), copper (Cu), titanium (Ti), tantalum (Ta), or a combination thereof.

12. The semiconductor device structure of claim 5, wherein the L-shaped liner extends to the third dielectric layer.

13. The semiconductor device structure of claim 5, wherein the L-shaped liner extending to the third dielectric layer is in direct contact with the outer silicide portion.

14. The semiconductor device structure of claim 5, wherein the L-shaped liner comprises silicon nitride.

15. The semiconductor device structure of claim 1, wherein the barrier layer and the metal layer disposed in the third dielectric layer are in direct contact with the outer 5 silicide portion.

16. The semiconductor device structure of claim 1, further comprising an air gap disposed in the second dielectric layer and next to the L-shaped liner.

17. The semiconductor device structure of claim 16, further comprising a liner disposed in the second dielectric layer and enclosing the air gap.

* * * * *